US012609165B2

(12) United States Patent
Dutertre

(10) Patent No.: US 12,609,165 B2
(45) Date of Patent: Apr. 21, 2026

(54) METHOD FOR DETECTING AN ERROR IN AN ELECTRONIC MEMORY

(71) Applicant: INSTITUT MINES TELECOM, Palaiseau (FR)

(72) Inventor: Jean-Max Dutertre, Aix-en-Provence (FR)

(73) Assignee: INSTITUT MINES TELECOM, Palaiseau (FR)

( * ) Notice: Subject to any disclaimer, the term of this patent is extended or adjusted under 35 U.S.C. 154(b) by 154 days.

(21) Appl. No.: 18/686,175

(22) PCT Filed: Jun. 20, 2022

(86) PCT No.: PCT/EP2022/066738
§ 371 (c)(1),
(2) Date: Feb. 23, 2024

(87) PCT Pub. No.: WO2022/268726
PCT Pub. Date: Dec. 29, 2022

(65) Prior Publication Data
US 2024/0386967 A1 Nov. 21, 2024

(30) Foreign Application Priority Data

Jun. 21, 2021 (FR) ...................................... 2106586

(51) Int. Cl.
*G11C 16/22* (2006.01)
*G11C 16/04* (2006.01)
*G11C 29/12* (2006.01)
(52) U.S. Cl.
CPC .......... *G11C 16/22* (2013.01); *G11C 29/1201* (2013.01); *G11C 16/0408* (2013.01); *G11C 2029/1204* (2013.01)
(58) Field of Classification Search
None
See application file for complete search history.

(56) References Cited

U.S. PATENT DOCUMENTS 6,141,257 A * 10/2000 Rochard .............. G11C 7/1045
365/210.1
9,081,062 B1 * 7/2015 Pedersen ................ G11C 29/52
(Continued)

FOREIGN PATENT DOCUMENTS

WO WO-2009154799 A1 * 12/2009 ......... G11C 11/5642

OTHER PUBLICATIONS

International Search Report (ISR) for PCT/EP2022/066738 mailed Sep. 23, 2022 (5 pages).
(Continued)

*Primary Examiner* — Guerrier Merant
(74) *Attorney, Agent, or Firm* — Jason A. Smith; Shumaker, Loop & Kendrick, LLP

(57) ABSTRACT

A method for detecting at least one fault caused by a photoelectric or radiative effect in a non-volatile semiconductor memory, the memory including a plurality of memory cells (CM) containing MOS transistors, potentially floating-gate MOS transistors, each memory cell being located at the intersection of an elementary bit line (BLE) and of a word line (WL), the binary content of a memory cell being read out by detecting a read current ($I_{lecture}$) flowing through this memory cell during read-out after this memory cell has been selected by means of the elementary bit line and word line, in which method the potential presence of at least one fault during read-out or programming of a memory cell is detected by making a comparison between the total current flowing through the elementary bit line via which detection is performed, and a predefined threshold ($I_{alarm}$) representative of the presence of at least one fault.

26 Claims, 23 Drawing Sheets

(56)　　　　　References Cited

U.S. PATENT DOCUMENTS

| | | | |
|---|---|---|---|
| 2003/0185040 A1 | 10/2003 | Rickes et al. | |
| 2007/0198892 A1* | 8/2007 | Ng | G06F 11/1008 |
| | | | 714/763 |
| 2007/0279966 A1* | 12/2007 | Houston | G11C 11/412 |
| | | | 365/154 |
| 2014/0211547 A1* | 7/2014 | Kapre | H10D 84/854 |
| | | | 365/226 |
| 2015/0279473 A1* | 10/2015 | Yoo | G11C 16/28 |
| | | | 365/185.18 |
| 2017/0040043 A1 | 2/2017 | Weiner | |
| 2017/0213595 A1* | 7/2017 | Park | G11C 16/06 |

OTHER PUBLICATIONS

Written Opinion (WO) for PCT/EP2022/066738 mailed Sep. 23, 2022 (16 pages).
International Preliminary Report on Patentability for PCT/EP2022/066738 mailed Dec. 14, 2023 (18 pages).
Kathrin Garb et al. "Temporary Laser Fault Injection Into Flash Memory: Calibration, Enhanced Attacks, and Countermeasures" 26th IEEE International Symposium on On-Line Testing and Robust System Design (IOLTS) 2020 (7 pages).
Brice Colombier et al. "Laser-induced Single-bit Faults in Flash Memory: Instructions Corruption on a 32-bit Microcontroller" 2019 IEEE International Symposium on Hardwar Oriented Security and Trust (HOST)(10 pages).
Raphael Viera et al. "Permanent Laser Fault Injection into the Flash Memory of a Microcontroller" 2021 IEEE International New Circuits and Sysmtes Conference (NEWCAS), Jun. 2021, Toulon France, p. 1-4.
Alexandre Menu et al. "Single-bit Laser Fault Model in NOR Flash Memories: Analysis and Exploitation" (8 pages).
Junichi Sakamoto et al. "Laser-Induced Controllable Instruction Replacement Fault Attack" IEICE Trans. Fundamentals, vol. E103-A, No. Jan. 1, 2020 p. 11-20 (10 pages).

* cited by examiner

Circuit diagram                    Conventional layout

Circuit diagram                    Modified layout

Circuit diagram                    Modified layout

CM

BLE

WL

Tse

CG

Teg

CGL

FG

Circuit diagram

Conventional layout

WL (gate)

BLE (metal level 1)

SL (diffusion)

M1
metal of level 1
of the BLE

Decomposition of the layout

Mask DIFF
for the diffusions
of the transistor:
source (SL) and drain

Mask POLY for
the gate of the
transistor, WL

VIA1
metal
connecting
DIFF to M1

METHOD FOR DETECTING AN ERROR IN AN ELECTRONIC MEMORY

TECHNICAL FIELD

The present invention relates to detection of read and write faults in an electronic memory, and more particularly in non-volatile semiconductor memories.

BACKGROUND

Injection of temporary faults into integrated circuits is commonly used to attack integrated circuits and secure systems. Pulsed lasers provide a convenient and easily controllable way of injecting such faults, by creating transient currents in PN junctions or transistor channels via the photoelectric effect.

A number of types of countermeasures for countering these laser attacks have been reported in the literature, namely physical barriers (e.g., metal shields), device architectures with small sensitive volumes (e.g., fully depleted silicon-on-insulator: FD-SOI), hardware redundancy for detecting malfunction of the corrupted circuit, and scrambling and encryption techniques.

These approaches have drawbacks and/or weaknesses.

Shielding approaches may be incompatible with integrated-circuit manufacturing limits (such as metal-density rules) or may limit performance. Devices with an inherently low photonic sensitivity generally compromise other aspects of device performance, and in any case may be defeated by increasing incident light intensity. Hardware redundancy, although effective, requires duplicated circuit functions, is costly in terms of silicon footprint, and may be bypassed using attacks that affect the redundant paths in the same way. Scrambling and encryption may be thwarted through reverse engineering.

The publications Colombier et al. "Laser-induced Single bit Faults in Flash Memory: Instructions Corruption on a 32-bit Microcontroller", Garb et al. "Temporary Laser Fault Injection into Flash Memory: Calibration, Enhanced Attacks, and Countermeasures", Menu et al. "Single-bit Laser Fault Model in NOR Flash Memories: Analysis and exploitation", Sakamoto et al. "Laser-Induced Controllable Instruction Replacement Fault Attack" and Viera et al. "Permanent Laser Fault Injection into the Flash Memory of a Microcontroller" disclose attacks based on injection of faults into memories and certain techniques for counteracting them.

SUMMARY OF THE INVENTION

There remains a need to further improve methods for detecting a fault in a memory, in particular in terms of effectiveness, practicality, reliability and cost.

The invention aims to meet this objective and relates, according to one of its aspects, to a method for detecting at least one fault caused by a photoelectric or radiative effect in a non-volatile semiconductor memory, the memory in particular being a NOR flash memory, an EEPROM or a ROM, the memory comprising a plurality of memory cells containing MOS transistors, potentially floating-gate MOS transistors, each memory cell being located at the intersection of an elementary bit line and of an associated word line, the binary content of a memory cell being read out by detecting a read current flowing through this memory cell during read-out after this memory cell has been selected by means of the associated elementary bit line and word line, in which method, to detect the potential presence of at least one fault during read-out of one or more memory cells, a comparison is made between the total current flowing through the one or more associated elementary bit lines, and a predefined threshold representative of the presence of at least one fault in these one or more memory cells.

In particular, the invention relates, according to one of its aspects, to a method for detecting at least one fault caused by a photoelectric or radiative effect in a non-volatile semiconductor memory, the memory in particular being a NOR flash memory, an EEPROM or a ROM, the memory comprising a plurality of memory cells containing MOS transistors, potentially floating-gate MOS transistors, each memory cell being located at the intersection of an elementary bit line and of a word line, in which method:

to detect the potential presence of at least one fault during read-out of a memory cell, the binary content of a memory cell being read out by detecting a read current flowing through this memory cell during read-out after this memory cell has been selected by means of the elementary bit line and word line, a comparison is made between the total current flowing through the elementary bit line to which the memory cell being read out belongs, or flowing through at least one elementary bit line other than the one to which the memory cell being read out belongs, and a predefined threshold representative of the presence of at least one fault in the one or more memory cells other than the one being read out, and/or to detect the potential presence of at least one fault during programming of at least one memory cell, in particular when the latter is a NOR flash memory or an EEPROM, a comparison is made between the current flowing through at least one elementary bit line other than the one to which the memory cell being programmed belongs, and a predefined threshold representative of the presence of at least one fault in this line.

Programming, also called writing, consists in storing electrons in the floating gate of a floating-gate transistor of a flash memory or the floating-gate state transistor of an EEPROM memory cell.

The invention makes it possible to obtain a method for detecting a read or write fault that is reliable and relatively simple to implement.

The method according to the invention allows the process of writing a program to memory or of writing data to be protected.

Read or Write Fault

The read or write fault affects a word of an instruction of a program or of a datum used by a program, this instruction or datum being stored in the memory.

This fault may be created by exposing the integrated circuit to a laser pulse for attack purposes. The parameters of the laser pulse are chosen so as to ionize the semiconductor material via the photoelectric effect and cause the appearance of a transient photoelectric current between the drain and the substrate of a MOS transistor (possibly a floating-gate MOS transistor). In the case of a read operation, this current causes one or more bits of the read word to be read erroneously. In the case of a write operation, this current causes one or more bits of the written word to be programmed erroneously.

The fault may also be created as a result of exposure to ionizing radiation, either intentionally for attack purposes, or by chance, for example when the memory is exposed to a radiative source emitting ionizing particles (heavy ions or protons, neutrons, X-rays and gamma rays). The disrupting current, whether generated by an ionizing particle or via the photoelectric effect, will be denoted $I_{PH}$ below.

In the case of a read fault, this fault is normally temporary, and ceases after the induced charge has been drawn.

The fault may affect one or more memory cells simultaneously.

It will be noted that the fault does not alter the binary value stored in the memory cell affected by a read fault, but causes temporary corruption of the binary value read. In the case of a write fault, a corrupted value is stored in the memory cell affected by the write fault. This corruption is temporary and may be corrected by writing a correct value when the memory cell is next programmed.

The detecting method according to the invention is preferably activated during read-out or programming of a memory cell. The detecting method according to the invention may also be activated before and/or after read-out or programming of said memory cell.

Predefined Threshold

The predefined threshold, when it is a current, is also called the alarm current.

The predefined threshold is chosen depending on the architecture of the detection circuit, and may correspond to a current that, according to the circumstances, is lower or higher than the read current normally observed in the absence of fault, being for example substantially equal to twice the intensity of the read current normally observed in certain examples of implementation of the invention. The current to which comparison is made may be flowing through the same elementary bit line as the one selected for read-out, or through at least one other line, in particular an adjacent line, as detailed below.

Elementary Bit Line via which Detection is Performed

In the case of detection of a read fault, said at least one elementary bit line via which fault detection is performed may be the one associated with the memory cell being read.

Said at least one elementary bit line via which fault detection is performed may be adjacent to the one associated with the memory cell being read out or programmed.

Fault detection may be performed via a single line adjacent to the one associated with the memory cell being read out or programmed.

Fault detection may be performed via the two lines flanking the elementary bit line associated with the memory cell being read out or programmed.

Said at least one elementary bit line via which fault detection is performed may belong to the same block as the memory cell being read out or programmed; a block is conventionally defined to be the set of elementary bit lines only one of which is selected to be read out or programmed. Said at least one elementary bit line via which fault detection is performed may belong to the block following or preceding the one comprising the memory cell being read out or programmed; these blocks are generally located in proximity in the memory.

Error detection may be performed via one or more elementary bit lines that are likely to be affected, which bit lines may be relatively far from the memory cell being read out or programmed and not necessarily adjacent to the line associated with the memory cell being read out or programmed. Error detection via one or more lines located in the vicinity of the memory cell being read out or programmed, in particular adjacent lines, is preferred.

Detection may be performed in the area of influence of the disrupting mechanism, i.e. the area in which the disrupting current induced is high enough to create a fault. This area may extend over a plurality of lines and/or concern a plurality of transistors (or memory cells) of each of the lines in the area of influence.

Error Detection Through Splitting Word Lines

In some examples of implementation, the memory comprises split word lines, each pair (of index p) of word lines having a word line of even index 2k and a word line of odd index 2k+1, the gates of the transistors of the memory cells being alternately connected to the word line of even index and to the corresponding word line of odd index, at least one pair of word lines having one of its lines raised to a read potential or to a write potential to activate the memory cells that are connected thereto and the other of its lines raised to a potential deactivating the memory cells that are connected thereto, so as to activate the read memory cells of every other elementary bit line or to program every other elementary bit line and to perform fault detection in said at least one elementary bit line adjacent to the one associated with the memory cell being read out or being programmed. Thus, said at least one elementary bit line adjacent to the one associated with the memory cell being read or being programmed is electrically isolated and therefore passes a current only in the event of a laser attack or of a radiative event. Therefore, the threshold of the alarm current may be set lower than in the case where the adjacent elementary bit line also passes a read current. In particular, the predefined threshold may in this case be set lower than twice the magnitude of the read current normally observed.

Error Detection Through Modification of the Connection of the Sources of the Transistors In some examples of implementation, the sources of the transistors associated with each elementary bit line are connected to a respective common line raised to a given potential, in particular ground, at least during read-out or programming of the corresponding memory cells, and the sources of the transistors associated with said at least one adjacent elementary bit line are electrically isolated from said given potential, in particular ground, at least during fault detection. Thus, said at least one adjacent elementary bit line has no path of electrical connection to said given potential and it therefore passes a current only in the event of a laser attack or of a radiative event. Therefore, the threshold of the alarm current may be set lower than in the case where the adjacent elementary bit line also passes a read current. In this case also, the predefined threshold may be set lower than twice the magnitude of the read current normally observed.

The term "electrically isolated" when applied to an elementary bit line must be understood to mean that the common line to which the sources are connected no longer allows the current normally observed during read-out to flow, and hence no current other than a photoelectric or radiative current, should one be observed, will flow through this elementary bit line, between the drain and the substrate of the one or more transistors affected by the disturbance. Said given potential biasing the sources of the transistors may be chosen depending on the type of memory, it being equal to a given voltage V, generally 0 V (electrical ground).

Repetition of Reading or Writing a Word

In case of detection of a read fault on an elementary bit line, read-out of that line is preferably repeated a predetermined number of times provided that a fault is still detected on that line.

In case of detection of a fault when programming a word in memory, programming of this word is repeated a predefined number of times provided that a fault is still detected.

If the fault ceases to be detected before the detection loop reaches its end, then read-out or programming of the memory cells may resume, the fault having temporarily affected read-out or programming of the memory. If the fault is still detected at the end of the detection loop, then a predefined action may be performed-for example, the program using the memory may be made secure or a redundant security circuit may be employed.

In case of fault detection, a signal may be generated, to warn the user, for example of an attempt to corrupt the memory or of the presence of a disruption.

The fault-detecting method may be implemented autonomously by virtue of one or more specialized circuits present within the memory chip; as a variant, the method is implemented by virtue of one or more circuits external to the memory chip.

The memory on which the detection is performed may have any capacity, and for example a capacity greater than or equal to 512 MB.

Memory Circuit

According to another of its aspects, the invention also relates to a non-volatile semiconductor memory circuit, in particular a NOR flash memory circuit, an EEPROM memory circuit or a ROM memory circuit, allowing the detecting method defined above to be implemented; this memory circuit may thus be configured to detect the potential presence of at least one fault caused by a photoelectric or radiative effect, and comprises a plurality of memory cells containing MOS transistors, potentially floating-gate MOS transistors, each memory cell being located at the intersection of an elementary bit line and of an associated word line, the binary content of a memory cell being read out by detecting a read current flowing through this memory cell during read-out after this memory cell has been selected by means of the associated elementary bit line and word line, the memory circuit comprising at least one alarm circuit the input of which is connected to at least one elementary bit line via which fault detection is performed, the alarm circuit having an output and being configured to make a comparison between the total current flowing through the one or more associated elementary bit lines during detection, and a predefined threshold representative of the presence of at least one fault in these one or more memory cells; the state of the output of the alarm circuit indicates whether or not said at least one fault is present.

In particular, another subject of the invention, according to another of its aspects, is a non-volatile semiconductor memory circuit, in particular a NOR flash memory circuit, an EEPROM memory circuit or a ROM memory circuit, allowing the detecting method defined above to be implemented; this memory circuit may thus be configured to detect the potential presence of at least one fault caused by a photoelectric or radiative effect, and comprises a plurality of memory cells containing MOS transistors, potentially floating-gate MOS transistors, each memory cell being located at the intersection of an elementary bit line and of a word line, the memory circuit comprising at least one alarm circuit the input of which is connected to at least one elementary bit line via which fault detection is performed, the alarm circuit having an output the state of which indicates whether or not said at least one fault is present, the alarm circuit being configured to:

detect the potential presence of at least one fault during read-out of a memory cell, the binary content of a memory cell being read out by detecting a read current flowing through this memory cell during read-out after this memory cell has been selected by means of the elementary bit line and word line, by making a comparison between the total current flowing through said at least one elementary bit line via which fault detection is performed, and a predefined threshold representative of the presence of at least one fault in one or more memory cells other than the one being read out, and/or detect the potential presence of at least one fault during programming of at least one memory cell, in particular when the latter is a NOR flash memory or an EEPROM, by making a comparison between the current flowing through at least one elementary bit line other than the one to which the memory cell being programmed belongs, and a predefined threshold representative of the presence of at least one fault in this line.

Such a memory circuit may be encapsulated within a memory chip or a microcontroller chip or any other microprocessor circuit.

The invention is applicable to many types of memory.

NOR Flash Memory

In the case of NOR flash memory, each memory cell may comprise a floating-gate MOS transistor the control gate of which is connected to the corresponding word line and the drain of which is connected to the corresponding elementary bit line.

EEPROM

In the case of EEPROM, each memory cell may comprise two transistors in series: a MOS selection transistor and a floating-gate state transistor, the gate of the selection transistor being connected to the word line associated with said cell, the drain of the selection transistor being connected to the elementary bit line associated with said cell, the control gate of the state transistor being connected to a bias voltage, the bias voltage in particular being either the supply voltage in read mode or ground.

The EEPROM may comprise an address decoder that transmits, for each elementary bit line, the bias voltage to the control gates of the state transistors. This allows the sources of the transistors of the elementary bit line adjacent to the line containing the memory cell being read to be electrically isolated from ground. Thus, the elementary bit lines adjacent to the one containing the cell being read have no path of electrical connection to ground and they therefore pass a current only in the event of a laser attack or of a radiative event. Therefore, the threshold of the alarm current may be set lower than in the case where the adjacent elementary bit line also passes a read current.

ROM

In the case of ROM, each memory cell may comprise a MOS transistor the gate of which is connected to the associated word line and the drain of which is connected to the associated elementary bit line, the memory circuit comprising a read-out device connected to each elementary bit line, the read-out device comprising a MOS pull-up transistor.

As a variant, the sources of the MOS transistors associated with each elementary bit line are connected to a respective common line raised to a given potential, in particular ground, at least during read-out of the corresponding memory cells, and the sources of the transistors associated with the at least one adjacent elementary bit line are electrically isolated from said given potential, in particular ground, at least during fault detection.

Column Decoder

The memory circuit preferably comprises a column decoder comprising a selection transistor connected to each elementary bit line for selection thereof, and comprising, for each elementary bit line via which fault detection is performed, an alarm transistor connected in parallel with the selection transistor, the alarm transistor being connected to said at least one alarm circuit.

Alarm Circuit

Preferably, the alarm circuit comprises at least one detection circuit, this detection circuit comprising a voltage comparator having a first input connected to a reference voltage and a second input connected to the alarm transistor of the elementary bit line via which fault detection is performed, the fault being detected when the voltage on the second input is lower than the reference voltage, the alarm transistor being on during fault detection.

In the case of ROM, said at least one detection circuit may be separate from the read-out device.

In the case of ROM and for the variant where the sources of the MOS transistors associated with each elementary bit line are connected to a respective common line raised to a given potential, the alarm circuit preferably comprises the read-out device, in particular without any separate additional detection circuit. Specifically, this configuration of the sources of the transistors in the ROM makes it possible not to have to add any separate detection circuit, because the alarm is triggered by detecting a current on an adjacent elementary bit line using the read-out device of the latter, the output of this device being able to generate an alarm bit.

BRIEF DESCRIPTION OF THE DRAWINGS

The invention will potentially be better understood on reading the following detailed description of non-limiting examples of implementation thereof, and on examining the appended drawings, in which.

DETAILED DESCRIPTION

Figure 1:
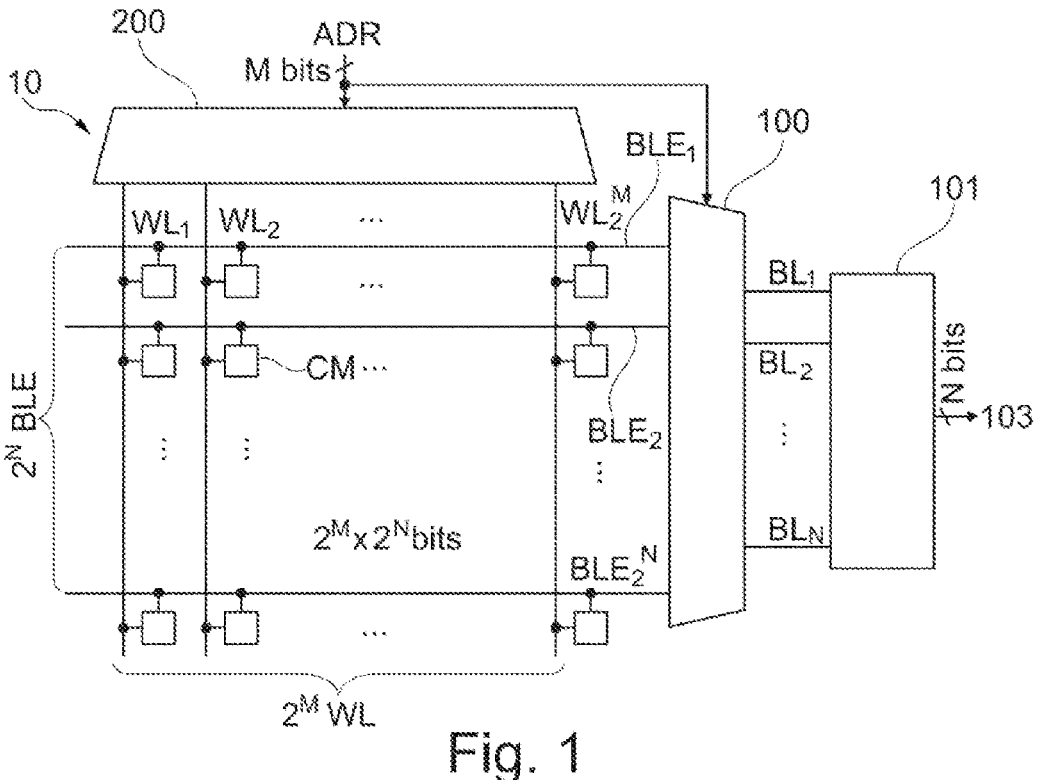
FIG. 1 is a schematic view of a memory architecture.

FIG. 1 schematically illustrates one example of a memory architecture 10 of matrix-array structure that is $2^M \times 2^N$ bits in size, it comprising $2^N$ elementary bit lines BLE (BLE$_1$, BLE$_2$, . . . , BLE$_2{}^N$), which are referred to as columns, and $2^M$ word lines WL (WL$_1$, WL$_2$, . . . , WL$_2{}^M$). Each memory cell CM is located at the intersection of a line BLE and of a line WL.

Binary address sequences ADR of M bits control an address decoder 200 for selecting word lines WL.

The same sequences ADR also control a column decoder 100 having as input the $2^N$ elementary bit lines BLE to be decoded and delivering as output N bit lines BL. The decoder 100 selects a single elementary bit line BLE, to electrically connect it to a bit line BL. Selection is achieved via the address ADR.

The N bit lines BL are input into a read circuit 101 that outputs a word 103 coded on N bits. A variant of such an architecture is shown in FIG. 2, in which the read circuit 101 is located upstream of the column decoder 100.

Figure 2:
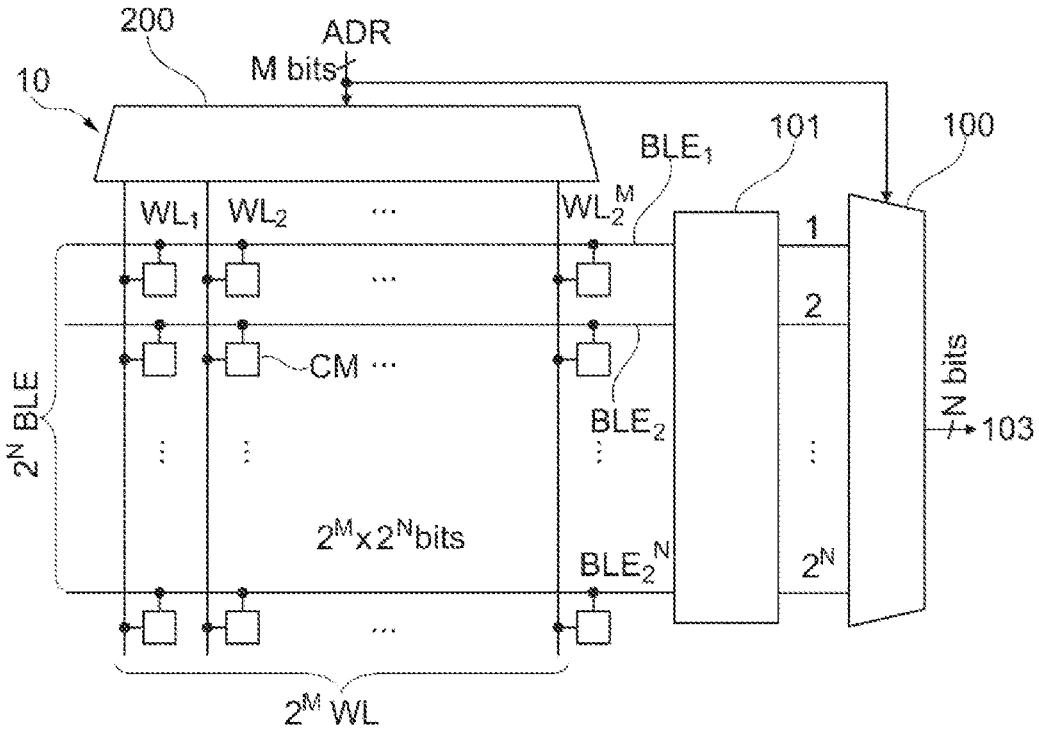
FIG. 2 is a view similar to FIG. 1 of a variant memory architecture.

The memory architectures 10 shown in FIGS. 1 and 2 are generic and apply to various types of memories including flash NOR memories, EEPROMs and ROMs.

Figure 3:
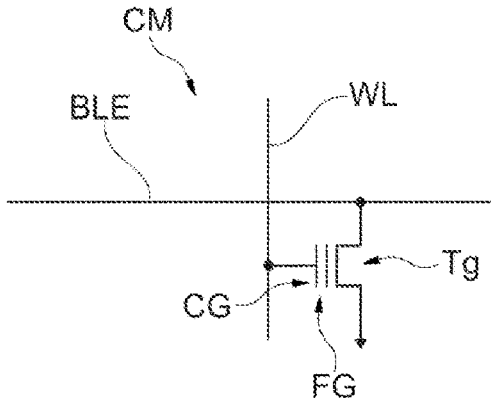
FIG. 3 schematically illustrates a NOR flash memory cell.

FIG. 3 schematically illustrates a NOR flash memory cell CM. Such a cell comprises a floating-gate transistor Tg. The control gate CG of this transistor is connected to the word line WL, its drain is connected to the elementary bit line BLE and its source is connected to ground. The floating gate is denoted FG and stores, according to a commonly used convention, the binary value 0 when the transistor is charged following programming thereof. In certain memories, the binary value 1 is stored.

It will be noted that, to simplify the description, in the examples of FIGS. 4, 6 to 12, 20 to 22, and 24 to 27 all the sources of the transistors are considered to be connected to ground. The sources may even be connected to common source lines, as detailed below.

Figure 4:
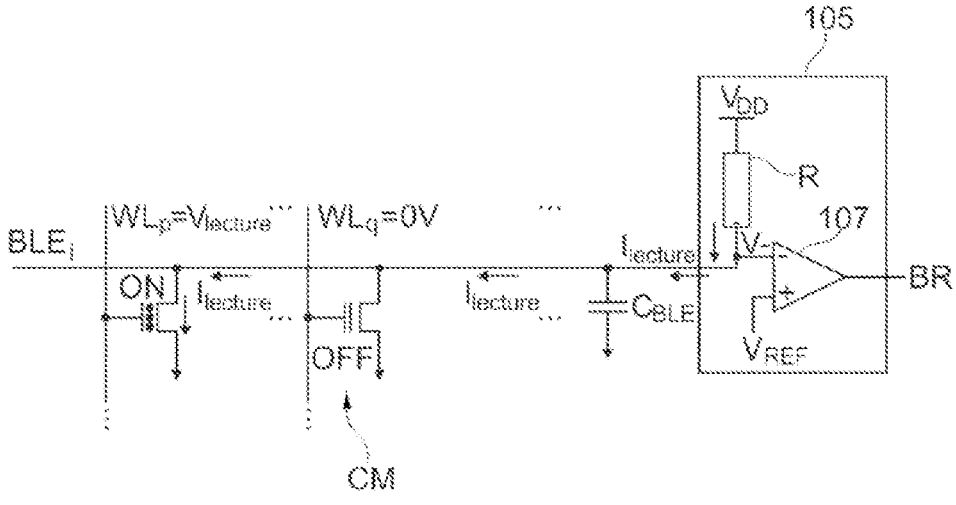
FIG. 4 schematically shows read-out of a bit in the memory cell illustrated in FIG. 3.

FIG. 4 schematically shows read-out of a bit in the memory cell CM illustrated in FIG. 3. The floating-gate transistor at the intersection of WL$_p$ and BLE$_i$ is read: a voltage V$_{lecture}$, higher than its threshold voltage is applied to the gate connected to WL$_p$ to turn it on (ON). All the transistors of the other memory cells CM connected in parallel to BLE$_i$ are off (OFF) because a zero voltage is applied to their gates. The elementary bit line BLE$_i$ is connected to a detection circuit 105, or any other equivalent device. The detection circuit 105 comprises a voltage comparator 107, the latter for example being a non-inverting differential amplifier, the non-inverting input terminal of which is connected to a reference voltage V$_{REF}$ and the inverting input terminal of which is connected to the bit line BLE$_i$ and to the supply voltage V$_{DD}$ via a resistor R.

Thus, a read current I$_{lecture}$ may flow through the transistor read. The detection circuit 105 converts the current I$_{lecture}$ into a voltage V− and compares this voltage with the reference voltage V$_{REF}$ by means of the voltage comparator 107. The output of the comparator 107 gives the value of the read bit BR.

A bit BR of value 0 is read when the floating-gate transistor is programmed, in a manner known per se. This transistor then has a high threshold voltage which results in a read current I$_{lecture}$ lower than the reference current I$_{REF}$. The current-to-voltage (I/V) conversion produces a voltage V− higher than the reference voltage V$_{REF}$.

Figure 5:
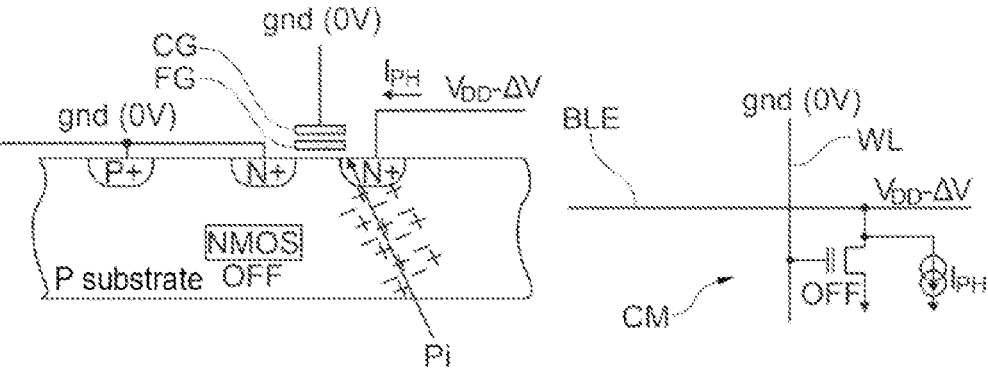
FIG. 5 schematically shows passage of an ionizing particle through the memory cell of FIG. 3 and a model of the resulting fault in the transistor.

FIG. 5 schematically shows the origin of a read fault that could affect the memory, namely passage of an ionizing particle Pi through the floating-gate transistor. The floating-gate transistor is for example an NMOS transistor, as shown in the figure. The particle Pi may be an ionizing radiative particle that causes charge to appear, or it may represent the beam of a laser generating charge via the photoelectric effect. The charge causes a transient current I$_{PH}$ to flow between the drain and the substrate of the transistor, thus causing temporary erroneous read-out of the corresponding bit. This fault is modeled by a source of disrupting current I$_{PH}$ between the source and drain.

Figure 6:
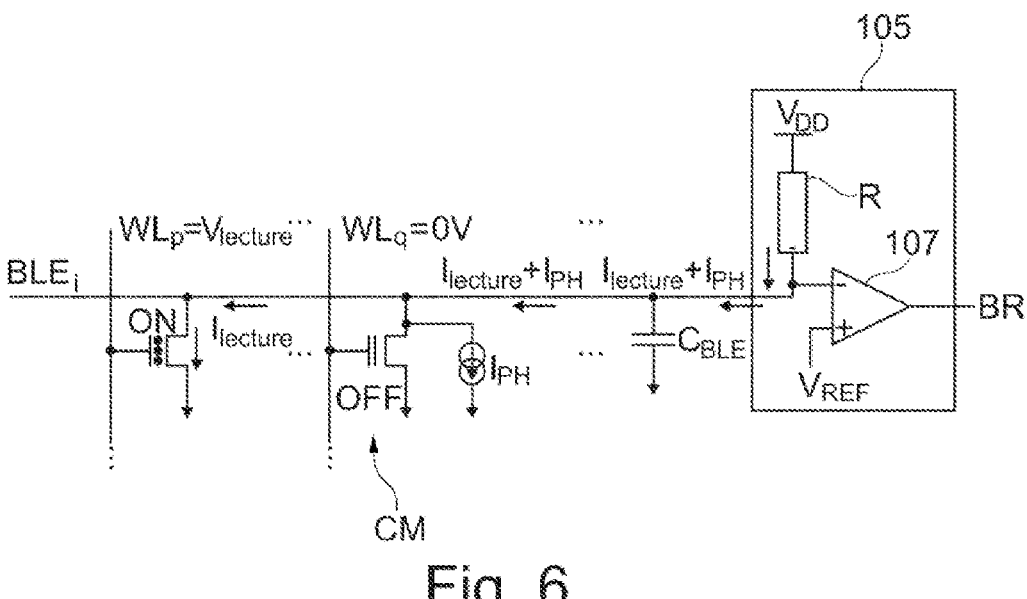
FIG. 6 is a figure similar to FIG. 4 with addition of a disrupting current.

As may be seen in FIG. 6, if the turned-off transistor located at the intersection of BLE$_i$ and WLq is present in the area of influence of the disturbing effect creating the faults, a current I$_{PH}$ appears which adds to the current I$_{lecture}$. The current received by the detection circuit 105 is now I$_{PH}$+I$_{lecture}$ and becomes higher than the reference current I$_{REF}$. The I/V conversion produces a voltage V− lower than the reference voltage V$_{REF}$. The output of the comparator 107 thus delivers a voltage corresponding to a bit BR of logic level 1, even though the binary value that would be read in the absence of the fault is 0.

It will be noted that although the value of the read bit is corrupted, the binary value stored by the read transistor is not modified. It is indeed a question of a read fault, and not of an alteration of the stored bit.

Figure 7:
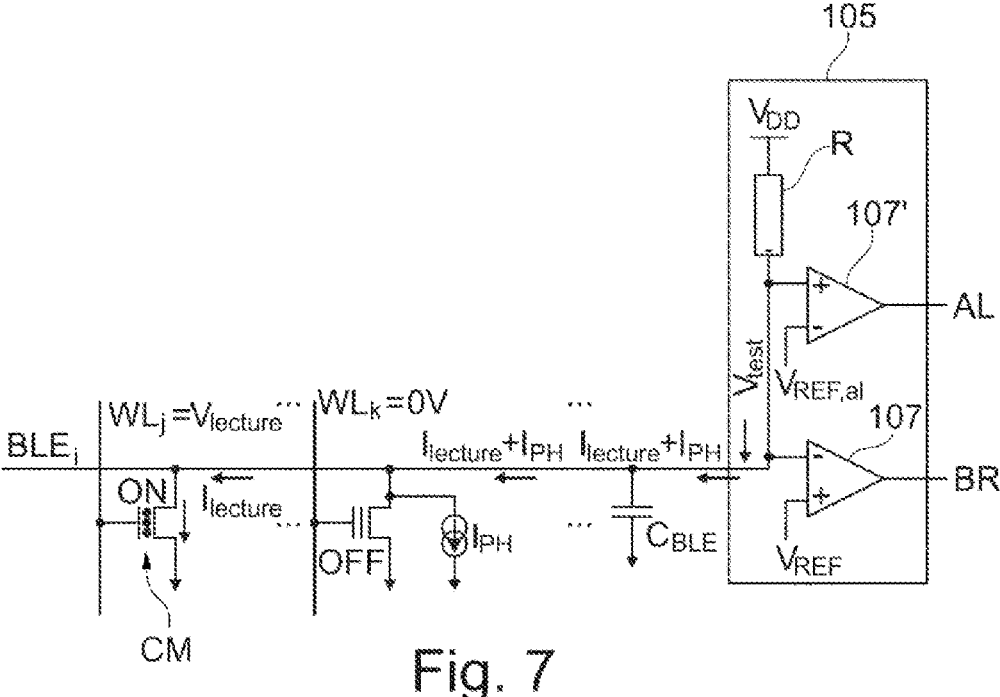
FIG. 7 schematically shows an elementary bit line of a NOR flash memory with an amplifier allowing a read fault to be detected according to the method of the invention.

In order to detect a read fault by implementing the method according to the invention, the detection circuit 105 of FIGS. 4 and 6 may, as schematically illustrated in FIG. 7, include an additional voltage comparator 107' the output of which takes a predefined state in the event of a read fault.

The voltage comparator 107' may also be a non-inverting differential amplifier the non-inverting input terminal of which is connected to the elementary bit line $BLE_i$, to the negative input terminal of the voltage comparator 107, and to the supply voltage $V_{DD}$ via a resistor R.

The inverting input terminal is connected to an alarm reference voltage $V_{REF, al}$. The voltage on the positive input terminal of the voltage comparator 107' is denoted $V_{test}$.

During read-out of a logical 0 without laser-or radiation-induced fault $$I_{lecture} = I_{lecture\ 0} \text{ and: } I_{lecture\ 0} < I_{REF}. \text{ Thus,}$$
$$V_{test,\ lecture\ 0} > V_{REF} \text{ and BR=0.}$$

During read-out of a logical 1 without fault $$I_{lecture} = I_{lecture\ 1} \text{ and: } I_{alarm} > I_{lecture\ 1} > I_{REF}. \text{ Thus,}$$
$$V_{REF,\ al} < V_{test,\ lecture\ 1} < V_{REF} \text{ and BR=1.}$$

Given that $$I_{lecture\ 0} < I_{REF} < I_{lecture\ 1} < I_{alarm},$$

$$V_{test,\ lecture\ 0} > V_{REF} > V_{test,\ lecture\ 1} > V_{REF,\ al}, \text{ and}$$

for $V_{test} < V_{REF,\ al}$, the comparator 107' delivers an output AL=0 that causes the alarm to be triggered. In terms of current, this corresponds to exceedance of an alarm threshold current $I_{alarm}$ in the elementary bit line $BLE_i$. Specifically, the alarm is triggered because $I_{PH} + I_{lecture} > I_{alarm}$.

The input terminals of the comparator 107' may be swapped. In this case, the state of the output AL=1 indicates detection of a fault.

One detection circuit 105 with comparator 107' is present for each of the N bits forming a word, i.e. for each of the bit lines $BL_i$.

Figure 8:
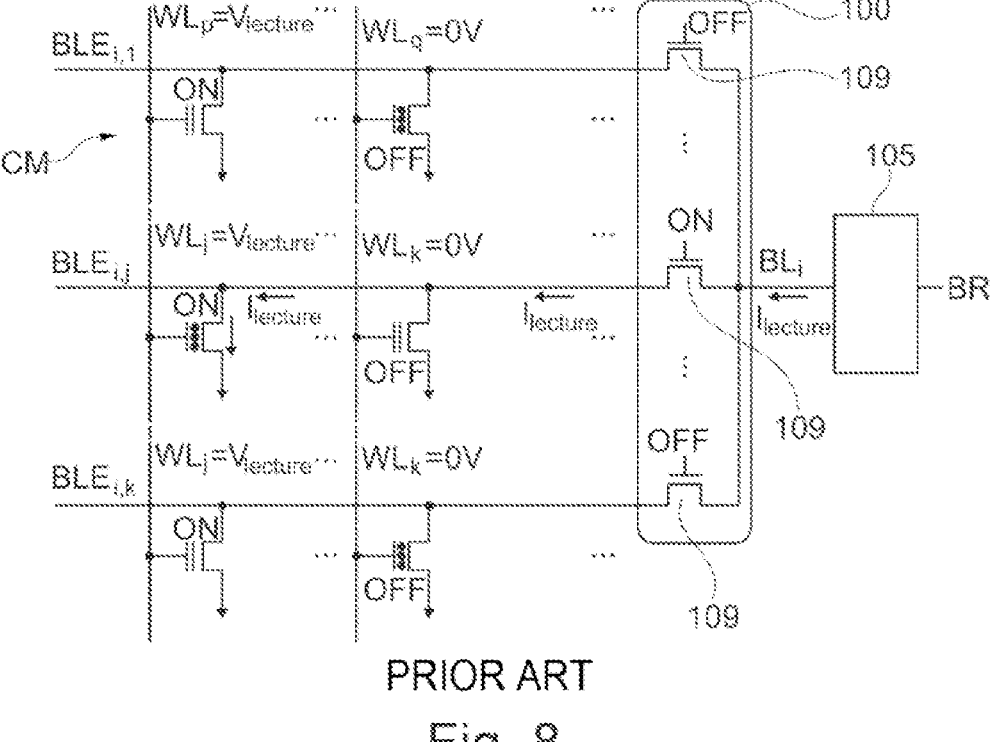
FIG. 8 schematically illustrates a NOR flash memory architecture with a conventional column decoder.

FIG. 8 schematically illustrates a block of a NOR flash memory architecture with a conventional column decoder 100. This block comprises a plurality of elementary bit lines K BLE ($BLE_{i,1}$, . . . , $BLE_{i,K}$) associated in parallel and connected via the column decoder 100 to the bit line $BL_i$ that gives the bit of index i when a word of N bits is read out.

The column decoder 100 comprises a selection transistor 109 connected to each elementary bit line.

The column decoder 100 selects a single line BLE, in the present case $BLE_{i,j}$, to electrically connect it to the line $BL_i$.

A conventional detection circuit 105 is connected downstream of the column decoder 100, and has the read bit BR as its output.

Such a block may be replicated for each of the N read bits forming a word (for each of the $BL_i$).

Figure 9:
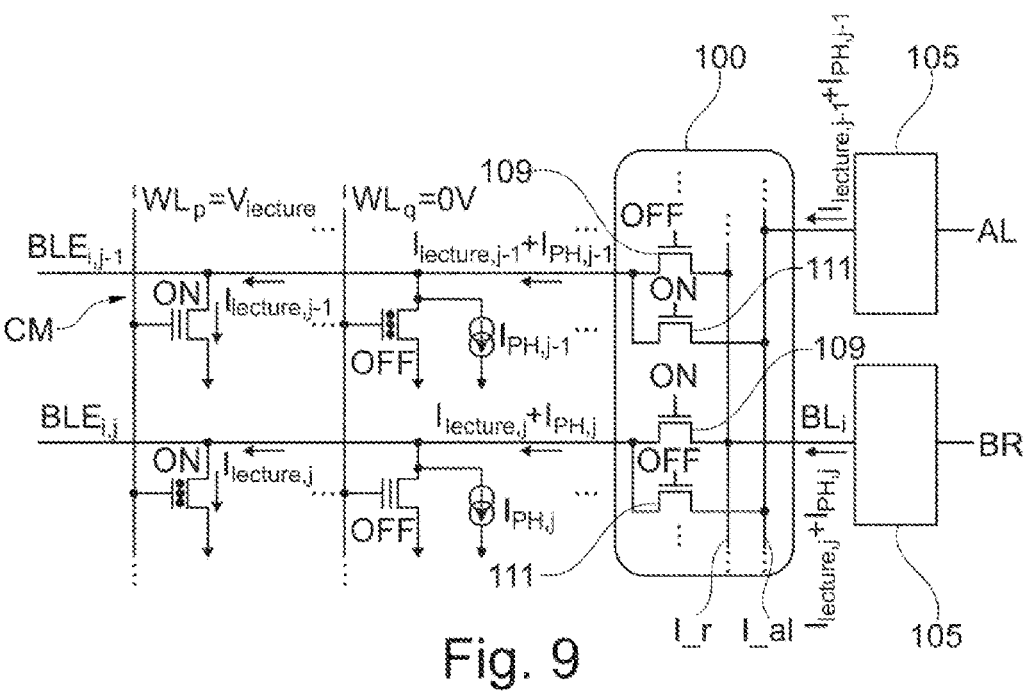
FIG. 9 schematically shows a NOR flash memory architecture with a column decoder modified according to the invention to detect a read fault in an elementary bit line adjacent to the one being read.

FIG. 9 shows a column decoder 100 according to the invention, configured to detect a read fault in an elementary bit line $BLE_{i,j-1}$ adjacent to the one being read $BLE_{i,j}$ or in the latter. For each elementary bit line, an alarm transistor 111 is connected in parallel with the selection transistor 109. All the selection transistors 109 are connected to a read line 1_r connected to a detection circuit 105 having as output read bit BR. All the alarm transistors 111 are connected to an alarm line 1_al connected to a detection circuit 105 having as output an alarm bit AL. The word line WL of index p ($WL_p$) is raised to the potential $V_{lecture}$. Since only the selection transistor 109 is in the ON state for the elementary bit line $BLE_{i,j}$ (the selection transistor 109 for $BLE_{i,j-1}$ being in the OFF state), only the cell passing $I_{lecture_{i,j}}$ is read.

The adjacent line BLE may be located immediately above or below the line BLE being read (or in proximity thereto, in the area of influence of the fault-creating effect).

The alarm transistor 111 connected to the adjacent line BLE ($BLE_{i,j-1}$ in FIG. 9) has been turned on with a view to detecting exceedance of an alarm threshold current $I_{alarm}$.

If $I_{PH,\ j-1} + I_{lecture,\ j-1} > I_{alarm}$, the alarm bit AL is activated. If a fault is detected, the circuit may read this line again later.

Figure 10:
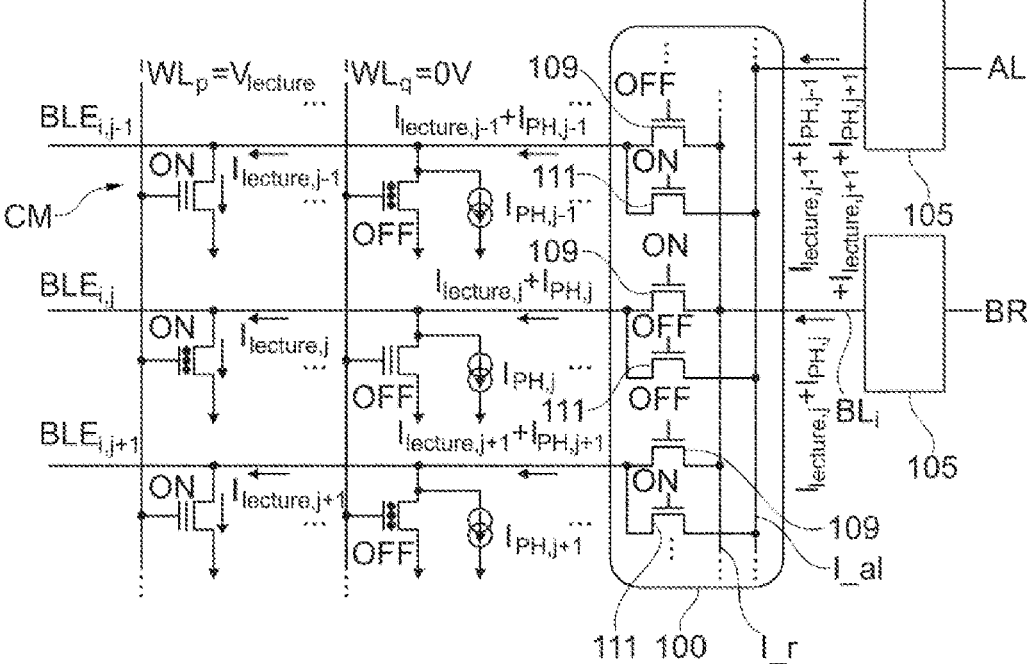
FIG. 10 schematically illustrates a NOR flash memory architecture with a column decoder modified according to the invention to detect read faults in two elementary bit lines adjacent to the one being read.

FIG. 10 schematically illustrates a NOR flash memory block the column decoder 100 of which is configured to detect exceedance of an alarm threshold current $I_{alarm}$ collected in two lines BLE adjacent to the line BLE connected to the floating-gate transistor being read out. The adjacent lines BLE are located immediately above or below the line BLE being read (or in proximity thereto, in the area of influence of the disrupting effect). In this example, the adjacent lines BLE in which faults are to be detected are the lines $BLE_{i,j-1}$ and $BLE_{i,j+1}$ located above and below the line $BLE_{i,j}$ being read out, respectively.

The column decoder 100 is arranged to connect the lines $BLE_{i,j-1}$ and $BLE_{i,j+1}$ to a detection circuit 105 with the aim of detecting a current $I_{PH,\ j-1} + I_{PH,\ j+1} + I_{lecture,\ j-1} + I_{lecture,\ j+1} > I_{alarm}$. If the alarm threshold current is exceeded, the alarm bit AL is activated. If a fault is detected, the read-out may be repeated a certain number of times.

Figure 11:
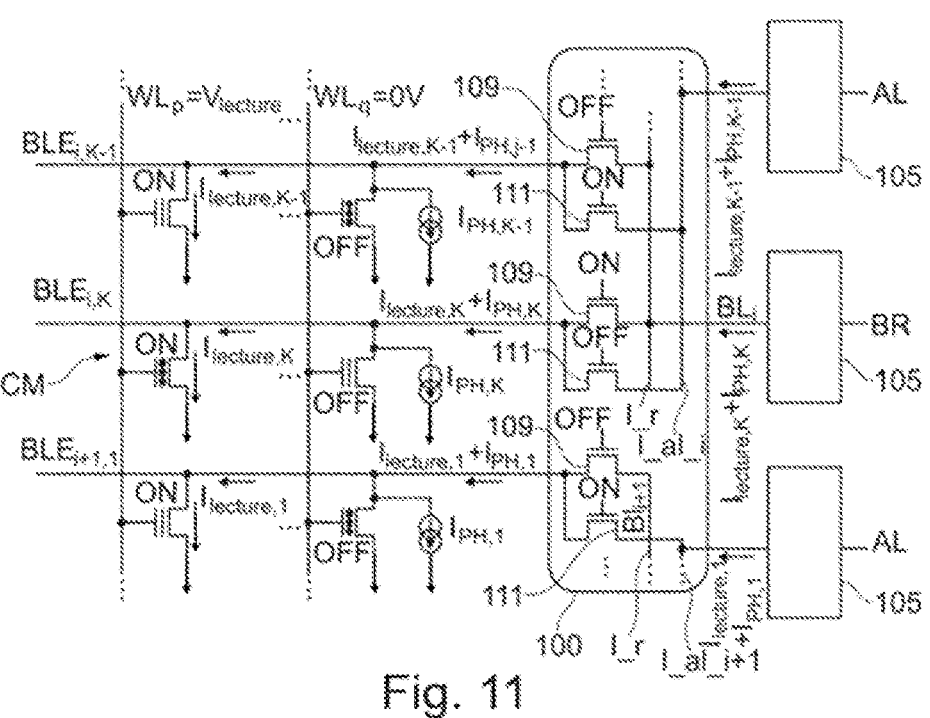
FIG. 11 schematically shows a NOR flash memory architecture with a column decoder modified according to the invention to detect a read fault in an elementary bit line located on a block edge.

An example of a NOR flash memory architecture allowing a read fault to be detected in lines BLE adjacent to a line BLE located on a block edge has been shown in FIG. 11. For the line $BLE_{i,K}$ located on the block edge and connected to the transistor being read, the following are measured: the current flowing through the line $BLE_{i,K-1}$ (belonging to the same block) and the current flowing through the line $BLE_{i+1,1}$ (BLE of the block containing the lines BLE of the bit of index i+1). For each of these currents, a detection circuit 105 is connected to the corresponding BLE.

Another example (not illustrated) regards a line $BLE_{i,1}$ located on a block edge and connected to the transistor being read; in this case the following may be measured: the current flowing through line $BLE_{i,2}$ (belonging to the same block) and the current flowing through line $BLE_{i-1,K}$ (BLE of the block containing the BLE of the bit of index i−1).

Figure 12:
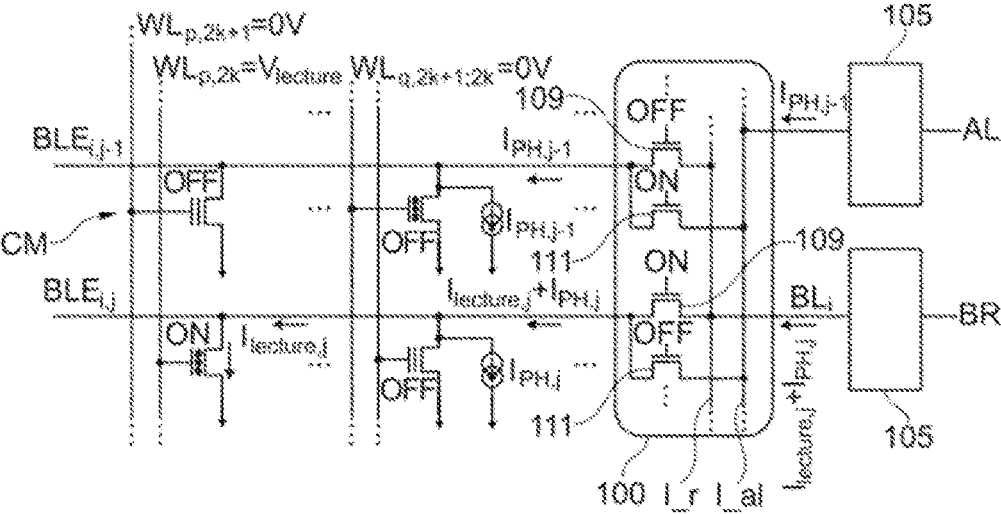
FIG. 12 schematically illustrates a NOR flash memory architecture with a column decoder modified according to the invention and split word lines.

FIG. 12 schematically illustrates a NOR flash memory architecture with a column decoder 100 comprising alarm transistors 111 in addition to selection transistors 109, and split word lines WL arranged in pairs. In the pair of index p, the word line of even index 2k, $WL_{p,\ 2k}$, is raised to a read potential $V_{lecture}$ in order to activate the memory cells that are connected thereto and the "odd" other word line 2k+1, $WL_{p,\ 2k+1}$, is raised to a potential deactivating the memory cells that are connected thereto. The floating-gate transistors of the read memory cells of every other line BLE are activated, given that, for a given pair of word lines, the gates of these transistors are connected alternately to the even word line and to the odd word line.

Thus, the lines BLE adjacent to the line BLE containing the transistor being read have no path of electrical connection to ground. Therefore they pass a current only in case of an event causing the fault effect.

Error detection may be performed either via the two adjacent lines flanking the one being read or via other lines close to the latter.

As shown in FIG. 12, all the floating-gate transistors of the line $BLE_{i,j-1}$ (adjacent to the line $BLE_{i,j}$ being read) are off, with a zero voltage applied to their control gates. Thus, it is possible to detect the disrupting current $I_{PH,\ j-1}$ flowing through the line $BLE_{i,j-1}$. The alarm current threshold $I_{alarm}$ may therefore be set lower than in the case where the line BLE adjacent to the one being read could also pass a read current.

Figure 13:
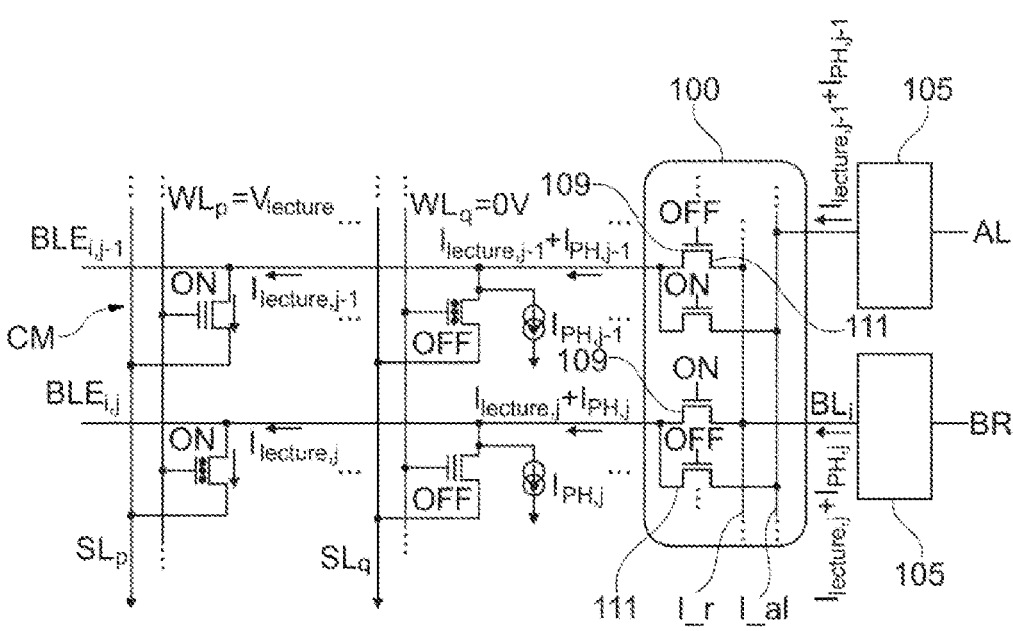
FIG. 13 schematically represents a NOR flash memory architecture with a column decoder modified according to the invention and conventional electrical connection of the sources of the floating-gate transistors.

FIG. 13 schematically shows a NOR flash memory architecture with a column decoder 100 comprising alarm transistors 111 in addition to selection transistors 109 and conventional electrical connection of the sources of the floating-gate transistors. The transistors located in the same word line have their sources connected to a common line SL raised to a given potential (in the present case ground). For example, the transistors the gates of which are connected to the word line $WL_p$ have their sources connected to $SL_p$. The transistors the gates of which are connected to the word line $WL_q$ have their sources connected to $SL_q$.

Figure 14:
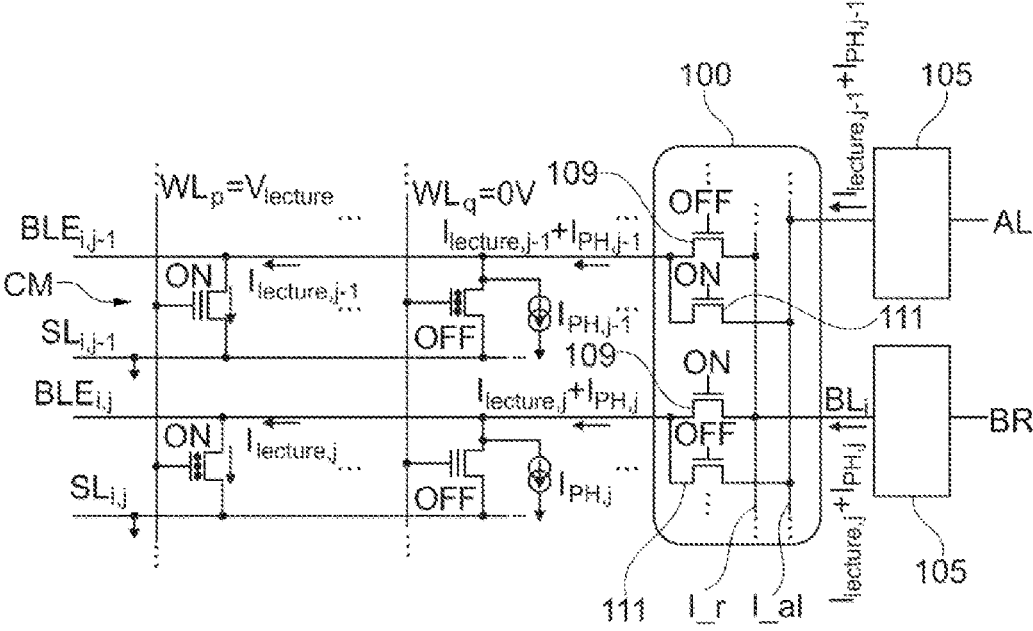
FIG. 14 schematically illustrates a NOR flash memory architecture with a column decoder modified according to the invention and modified electrical connection of the sources of the floating-gate transistors.

FIG. 14 illustrates connection of the sources of the transistors of the lines BLE such as to make it possible to electrically isolate from ground the sources of the floating-gate transistors of the line BLE adjacent (or of the 2 lines BLE adjacent) to the BLE containing the floating-gate transistor being read. The sources of the transistors of a given BLE are now connected to a common line SL raised to a given potential.

Figure 15:
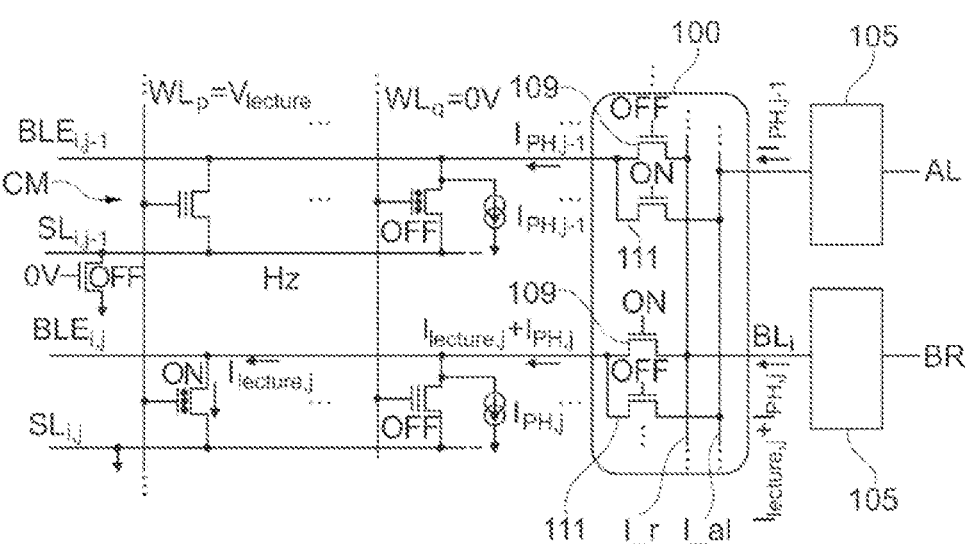
FIG. 15 is analogous to FIG. 14 with illustration of implementation of a technique for detecting read faults according to the invention.

If $SL_{i,j-1}$ is high impedance (HZ), as shown in FIG. 15, the elementary bit line $BLE_{i,j-1}$ (used to detect fault currents) adjacent to the line $BLE_{i,j}$ containing the transistor being read has no path of electrical connection to ground. It is thus possible to detect a disrupting current $I_{PH, j-1}$ flowing through the line $BLE_{i, j-1}$ with an alarm current threshold $I_{alarm}$ that may be set lower than in the case where the line BLE could also pass a read current.

Figure 16:
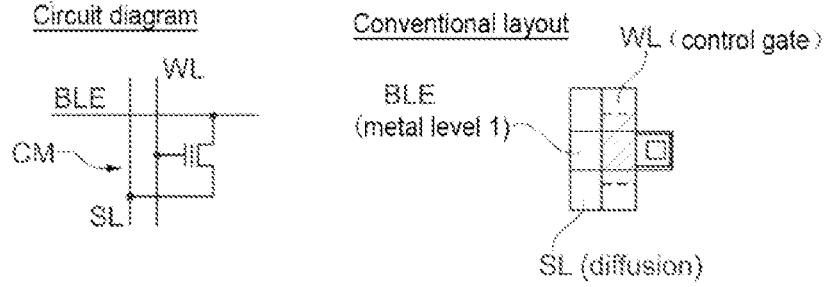
FIG. 16 schematically shows a conventional mask set for a NOR flash memory cell.
Figure 16:
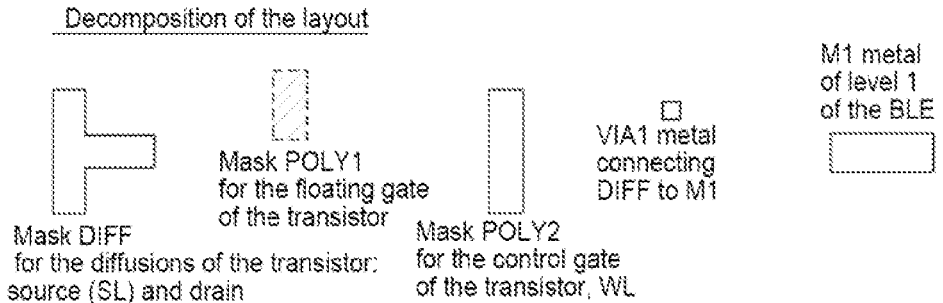

FIG. 16 schematically shows a conventional mask set for a NOR flash memory cell, showing the layout of the connections of the control gate, of the floating gate, of the drain and of the source of the transistor, with respect to the metal M1 of level 1 of the elementary bit line BLE. The (drain and source) diffusions of the transistor have the same DIFF mask, taking the form of a T rotated by 90° in the counter-clockwise direction. The source is connected to the source line SL. The floating gate has a mask POLY1 taking the form of a rectangle. The control gate, which is connected to the word line WL, also has a mask POLY2 taking the form of a rectangle. All these masks are superposed as required by the electronic-circuit manufacturing process used. The drain diffusion of the floating-gate transistor is connected by a via "vial" to the metal M1 of the elementary bit line BLE.

Figure 17:
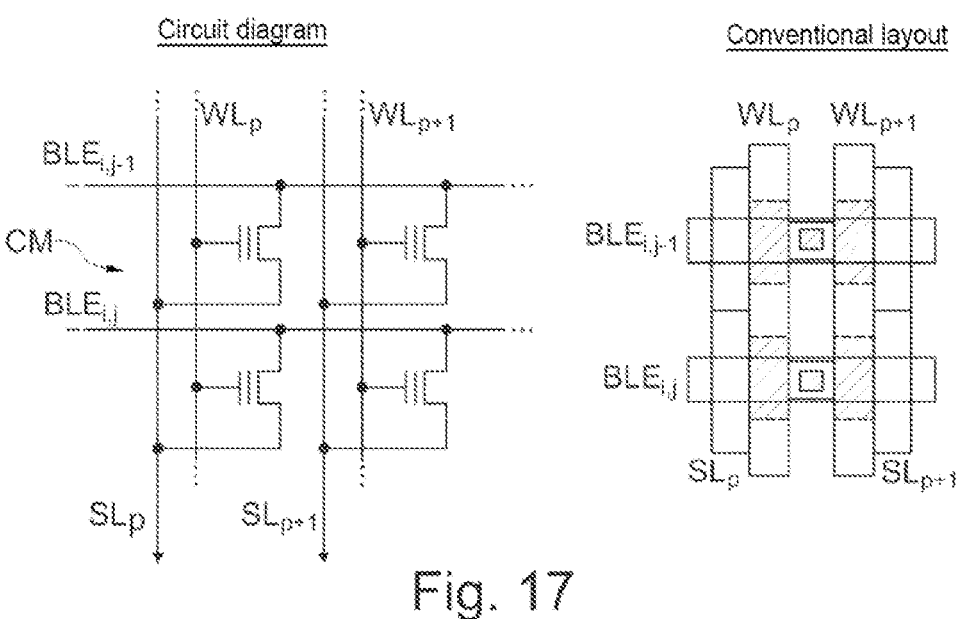
FIG. 17 schematically illustrates an example of a layout of mask sets for NOR flash memory cells allowing a memory array to be formed.

Juxtaposition of the mask sets of the memory cells CM forms a memory array in which the source lines SL and the word lines WL are parallel to one another and orthogonal to the elementary bit lines BLE, as schematically shown in FIG. 13 by way of example. Contact between the source diffusions of the transistors of the memory cells creates a source line SL. Contact between the masks POLY2 of the control gates CG of the transistors of the memory cells creates a word line WL. FIG. 17 illustrates this principle for a group of 4 transistors. Sharing elements of adjacent transistors allows the footprint of the memory to be decreased, without adversely affecting functionality.

Figure 18:
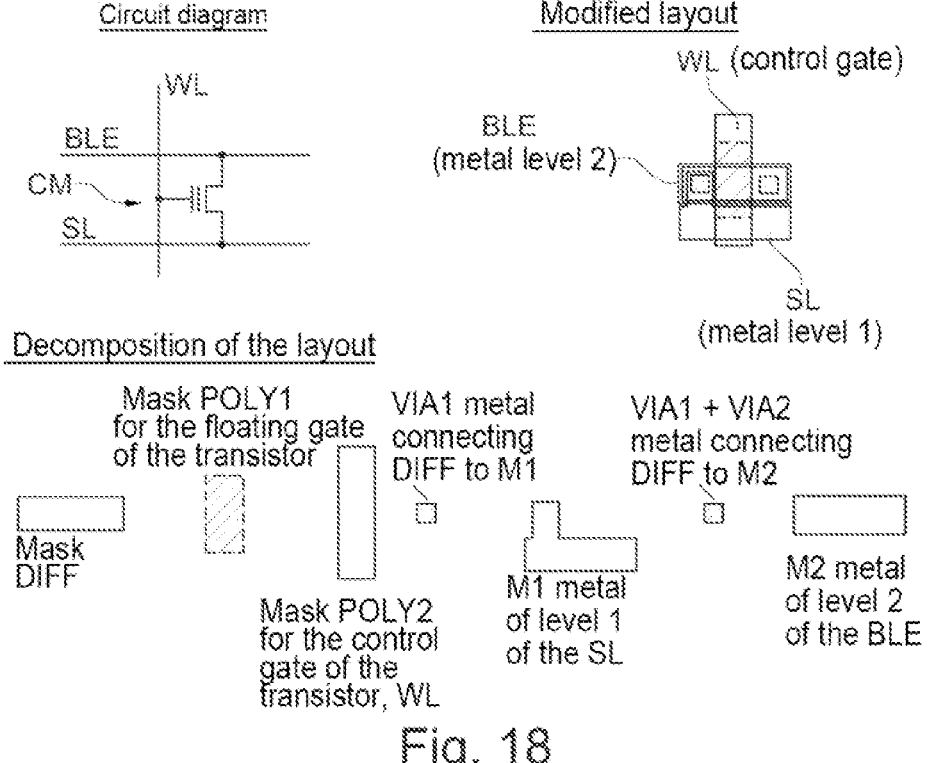
FIG. 18 schematically shows an example of a mask set for a NOR flash memory cell in the case of modified electrical connection of the sources of the floating-gate transistors.

FIG. 18 schematically illustrates an example of a mask set for a NOR flash memory cell according to the invention, in the case of modified electrical connection of the sources of the transistors. All the masks are superposed as required by the electronic-circuit manufacturing process used. The source diffusion of the floating-gate transistor is connected by a via "vial" to the metal M1 of the source line SL. The drain diffusion of the floating-gate transistor is electrically connected by two vias "vial" and "via2" to the metal M2 of the elementary bit line BLE. The control gate CG of POLY2 forms the word line WL. This layout makes it possible to obtain elementary bit lines BLE and source lines SL that are parallel to one another and orthogonal to WL, as for example shown in FIGS. 14 and 15.

Figures 19, 20:
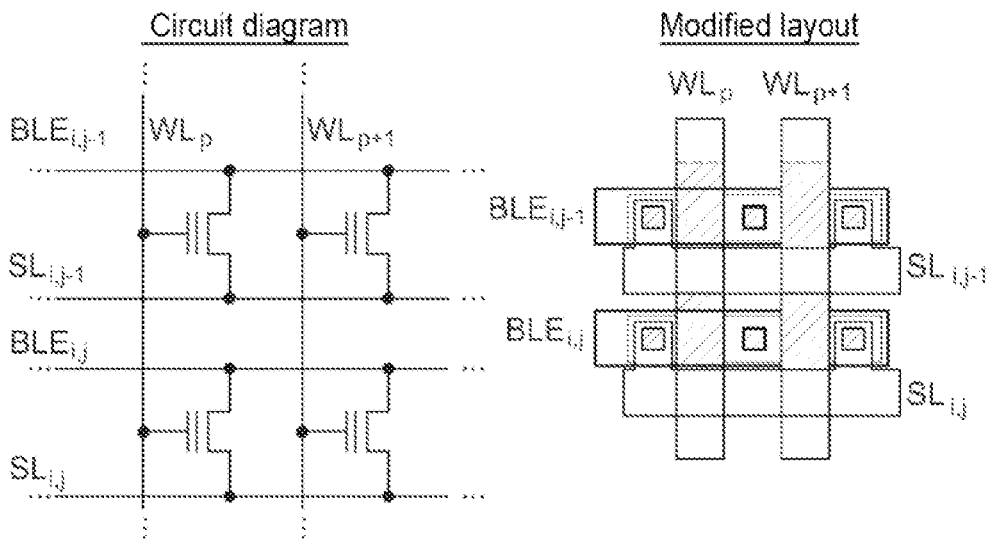
FIG. 19 schematically illustrates association of mask sets of a plurality of adjacent NOR flash memory cells in the case of modified electrical connection of the sources of the floating-gate transistors.
FIG. 20 schematically shows an EEPROM memory cell.

FIG. 19 schematically illustrates association of mask sets of a plurality of adjacent NOR flash memory cells in the case of modified electrical connection of the sources of the transistors.

The method for detecting read faults according to the invention also applies to an EEPROM. FIG. 20 schematically shows an EEPROM memory cell comprising two transistors in series: a floating-gate state transistor Teg and a selection transistor Tse which may be a standard MOS transistor. The transistor Teg has its source connected to ground and its gate connected to a gate control line CGL. The transistor Tse has its drain connected to an elementary bit line BLE and its gate connected to a word line WL.

Figure 21:
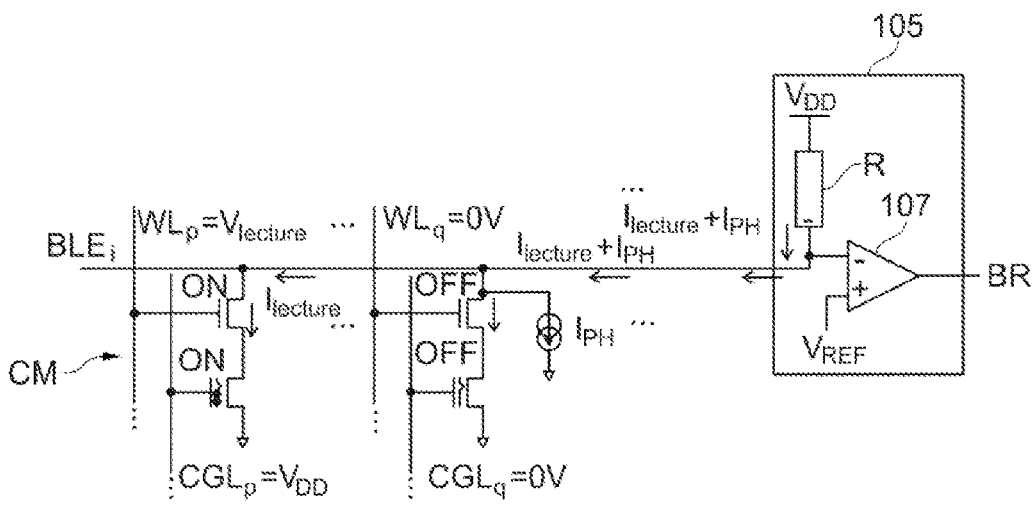
FIG. 21 is analogous to FIG. 6 in the EEPROM case.

In read mode, the gate control line CGL is connected to the supply voltage $V_{DD}$ or to another suitable read voltage. As illustrated in FIG. 21, $CGL_p=V_{DD}$ turns on the floating-gate transistor intended to be read, and $WL_p=V_{lecture}$ is applied to the gate of the selection transistor in order to allow the read current $I_{lecture}$ to pass.

The disrupting current $I_{PH}$ of photoelectric or radiative origin is created in the drain of the selection transistor of the EEPROM memory cell.

The techniques for detecting read faults that were described above with reference to NOR flash memory apply without major changes to the EEPROM case.

Specifically, to detect exceedance of an alarm current threshold, whether via the line BLE being read or one or more adjacent lines BLE, it is enough to provide at least one alarm transistor 111 and at least one detection circuit 105, the alarm transistor 111 being connected on the one hand to the line BLE via which the read fault is to be detected and on the other hand to the detection circuit 105. The rest of the connections are similar to the case of NOR flash memory, the control gates CGL of the transistors of the EEPROM needing to be connected to appropriate biasing potentials.

Regarding the technique for detecting read faults through splitting word lines, the EEPROM case is simpler because there are already two distinct control voltages: a voltage supplied by the word line WL for the selection transistor and a voltage supplied by the gate control line CGL for the floating-gate state transistor.

Figure 22:
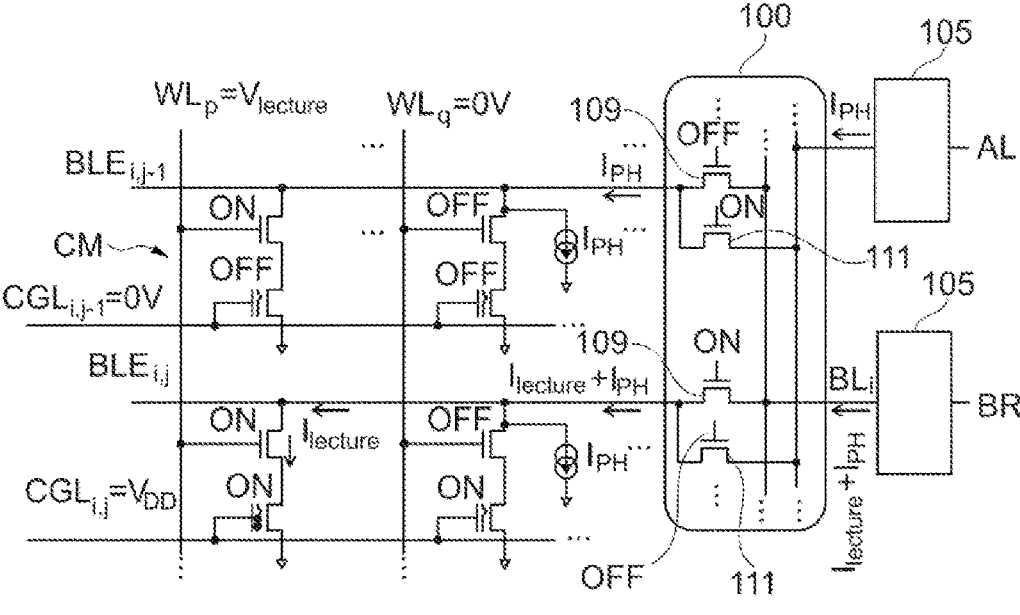
FIG. 22 is analogous to FIG. 9 in the EEPROM case.
Figure 23:
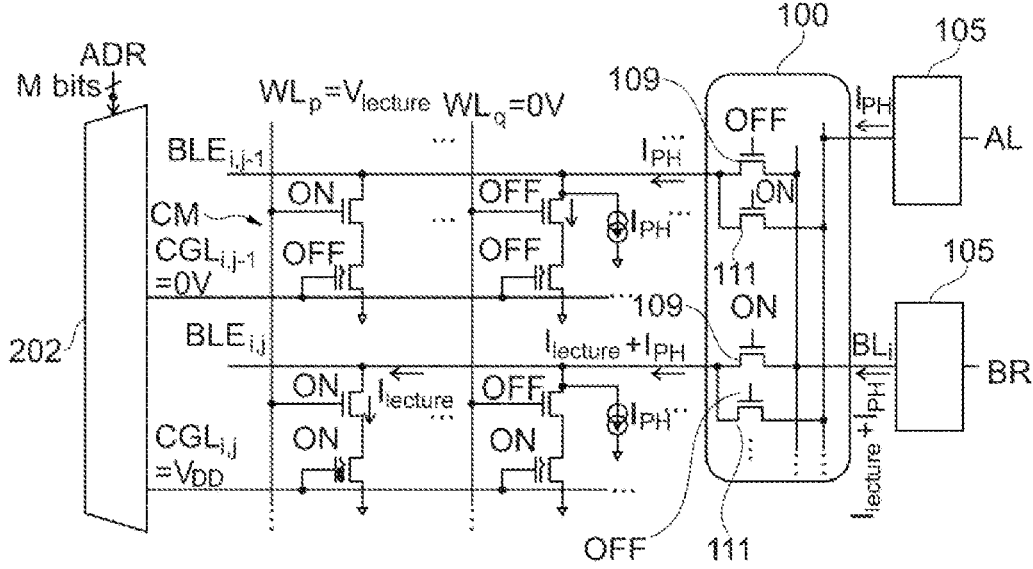
FIG. 23 is similar to FIG. 22 with addition of an additional address decoder.

Detection of the disrupting current in the adjacent line BLE is facilitated by modifying the bias connection of the gate of the floating-gate transistors, as shown in FIG. 22, so as to allow their state to be controlled on (ON) or off (OFF) independently of the word line WL. Thus, during read-out of the line $BLE_{i,j}$, the floating-gate transistors of the line $BLE_{i,j-1}$ are off (OFF). No current flows through the line $BLE_{i,j-1}$ in the absence of disrupting current. This approach requires addition of an additional address decoder 202, as shown in FIG. 23, the role of which is to transmit the correct voltage to the control gate lines CGL of the floating-gate transistors of the various lines BLE.

The method for detecting read faults according to the invention also applies to ROM.

Figure 24:
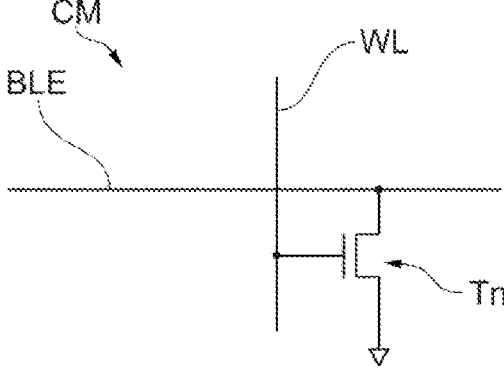
FIG. 24 is a schematic view of a ROM memory cell.

FIG. 24 is a schematic view of a ROM memory cell comprising a MOS transistor Tn, in the present case an NMOS transistor, the source of which is connected to ground, the gate of which is connected to the word line WL and the drain of which is connected to the line BLE.

The content of the ROM is fixed during manufacture of the circuit. When an operational MOS is inserted between the line BLE and the line WL, a logical 0 is conventionally stored in memory. When no MOS is inserted (or when the MOS inserted is inoperative) a logical 1 is stored. In certain memories, this convention is reversed.

Figure 25:
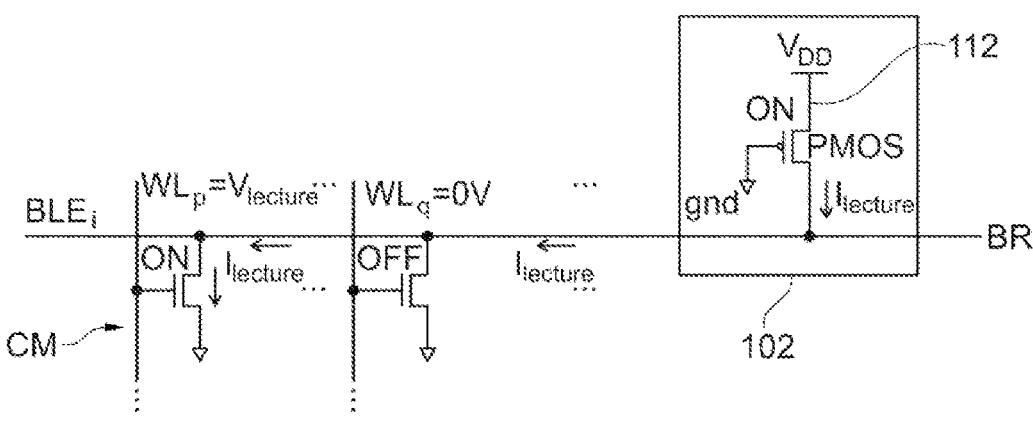
FIG. 25 schematically shows read-out of a logical 0 in the memory cell illustrated in FIG. 24.

FIG. 25 schematically shows read-out of a logical 0 in a ROM memory cell.

The elementary bit line BLE to which the transistor being read is connected (the gate of which transistor is connected to $WL_p = V_{lecture}$) comprises a read-out device 102. This read-out device 102 comprises a PMOS pull-up transistor 112 the gate of which is connected to ground, the source of which is connected to $V_{DD}$ and the drain of which is connected to the line $BLE_i$.

The NMOS transistors of the ROM memory cells are dimensioned so as to have a low voltage across their terminals, whereas the PMOS transistor 112 is dimensioned so as to have a high voltage across its terminals when an NMOS transistor and the PMOS transistor are passing the read current. Thus, the output voltage is substantially equal to 0 V, i.e. the read bit BR=0.

Figure 26:
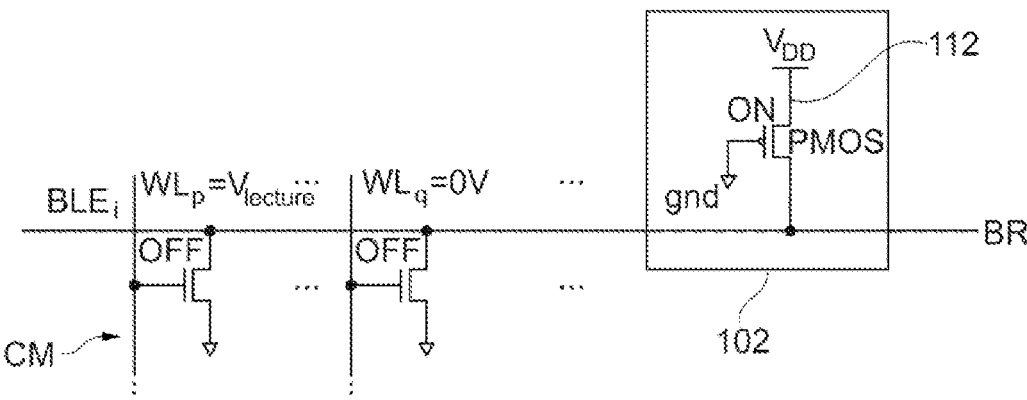
FIG. 26 schematically shows read-out of a logical 1 in the memory cell illustrated in FIG. 24.

FIG. 26 schematically shows read-out of a logical 1 in a ROM memory cell.

The read NMOS transistor (which is connected to the line $WL_p$ at the potential $V_{lecture}$) is inoperative. No current flows through it. This transistor does not allow a current to pass because it was incompletely built (by design) or it was rendered inoperative via a suitable implantation (by design) during manufacture of the memory. Therefore, the pull-up transistor 112 of the read-out device 102 ensures an output voltage substantially equal to $V_{DD}$, i.e. the read bit BR=1.

Figure 27:
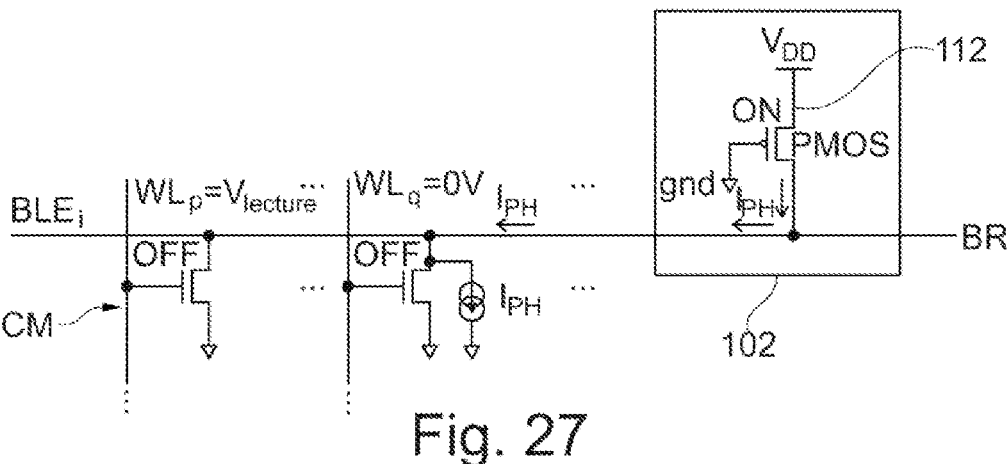
FIG. 27 is a figure analogous to FIG. 26 with modeling of injection of a fault by laser attack.

A disrupting current $I_{PH}$ affecting an adjacent memory cell, as illustrated in FIG. 27, causes a logical 0 to be read instead of a logical 1.

The techniques for detecting read faults that were described above with reference to NOR flash memory apply to the ROM case.

They require the read-out devices 102 to be replaced with detection circuits 105, with the exception of the detection technique involving modification of the connections of the sources of the transistors which does not require a detection circuit to be added (the alarm is then triggered by detection of a current on an adjacent BLE), as will be explained below.

Figure 28:
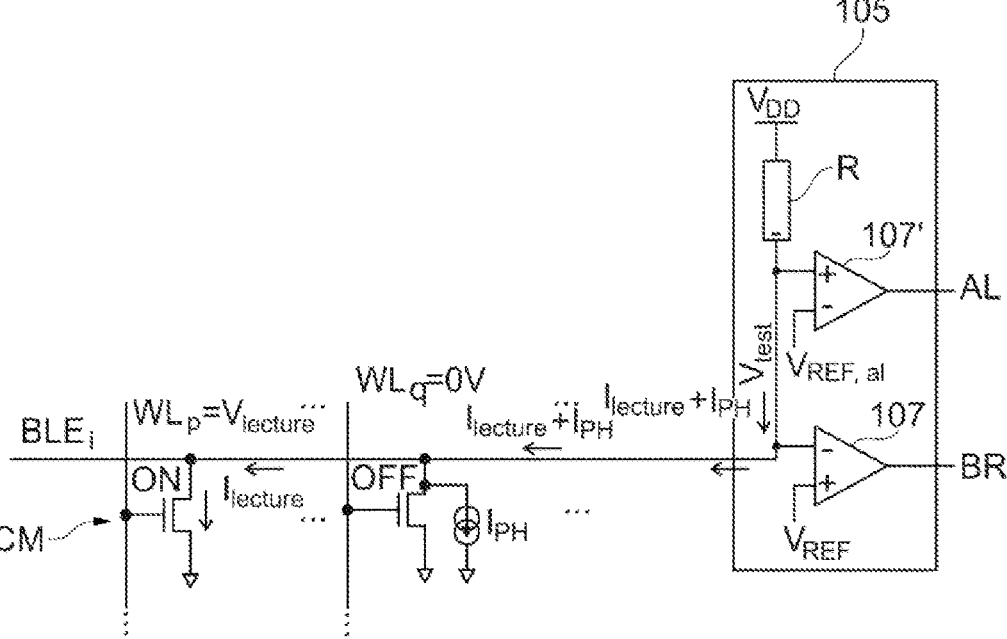
FIG. 28 is analogous to FIG. 7 in the ROM case.

FIG. 28 shows replacement of the read-out device 102 with a detection circuit 105. As in the case of NOR flash memory, the alarm is triggered when $I_{PH} + I_{lecture} > I_{alarm}$. Then $V_{test} < V_{REF, al}$.

Figure 29:
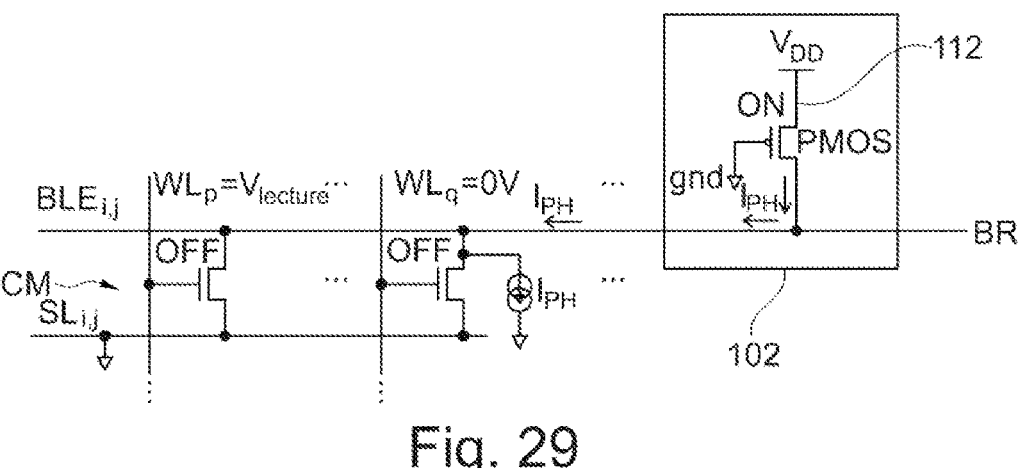
FIG. 29 schematically shows an elementary bit line of a ROM with modified electrical connection of the sources of the transistors.
Figure 30:
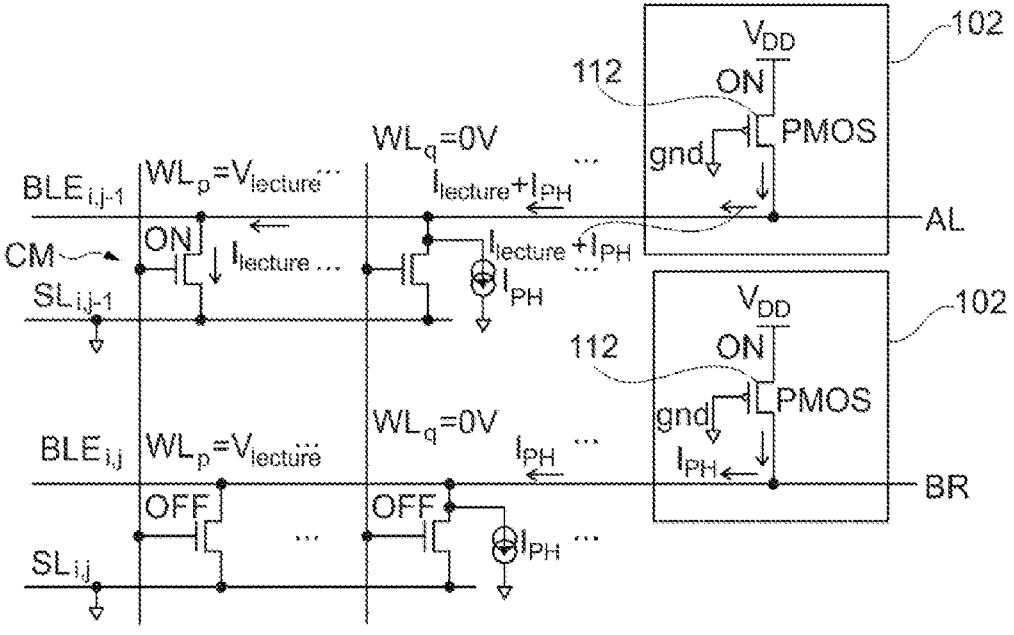
FIG. 30 schematically illustrates a ROM architecture with modified electrical connection of the sources of the transistors.

FIG. 29 shows a schematic of the electrical connection of the sources of the NMOS transistors of the elementary bit line $BLE_{i,j}$, conventional electrical connection whereby the sources of transistors connected to the same word line WL are connected to the same potential (as shown in FIG. 13 for the case of NOR flash memory) not being shown for the ROM case. The sources of the transistors of the line $BLE_{i,j}$ are connected to a common line $SL_{i,j}$. Because of the injected disrupting current $I_{PH}$, a logical 0 is read instead of a logical 1. When all the sources of the transistors of an adjacent line $BLE_{i,j-1}$ are connected to ground via $SL_{i,j-1}$, as shown in FIG. 30, a read current, whether or not it is added to a disrupting current, is capable of triggering output of an alarm by the read-out device 102, such that AL=0.

Figure 31:
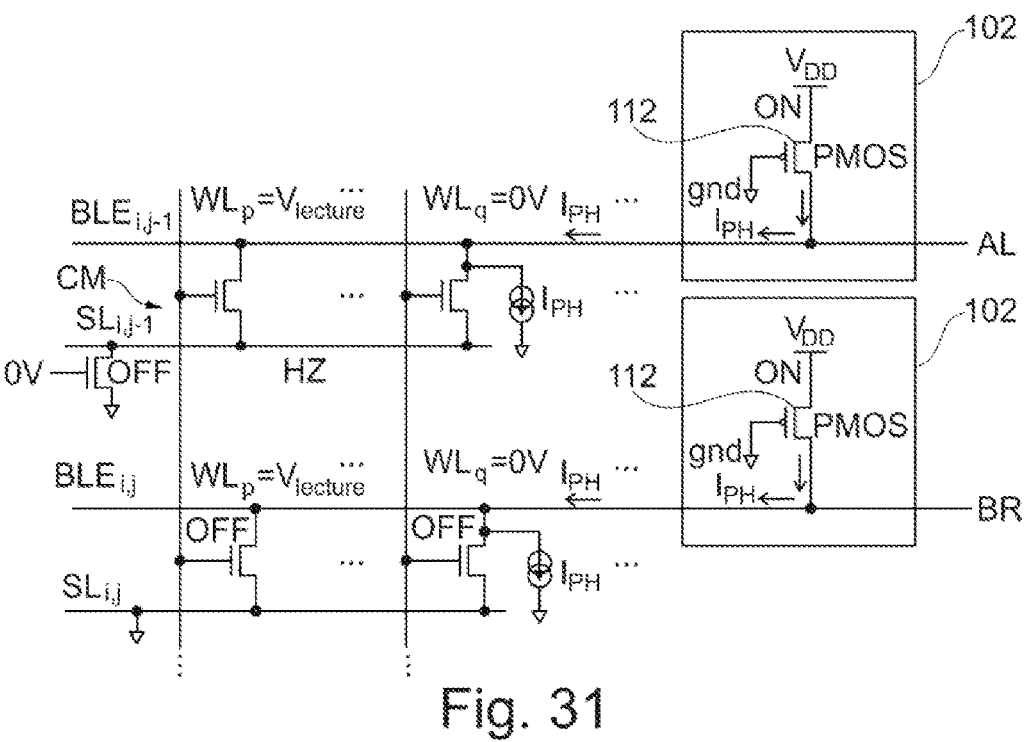
FIG. 31 is analogous to FIG. 30 with illustration of implementation of a technique for detecting read faults according to the invention.

Switching $SL_{i,j-1}$ to high impedance (HZ) sets $I_{lecture}=0$, as shown in FIG. 31. Thus, the disrupting current $I_{PH}$ is detected on $BLE_{i,j-1}$ and allows an alarm (AL=0) to be raised.

Figure 32:
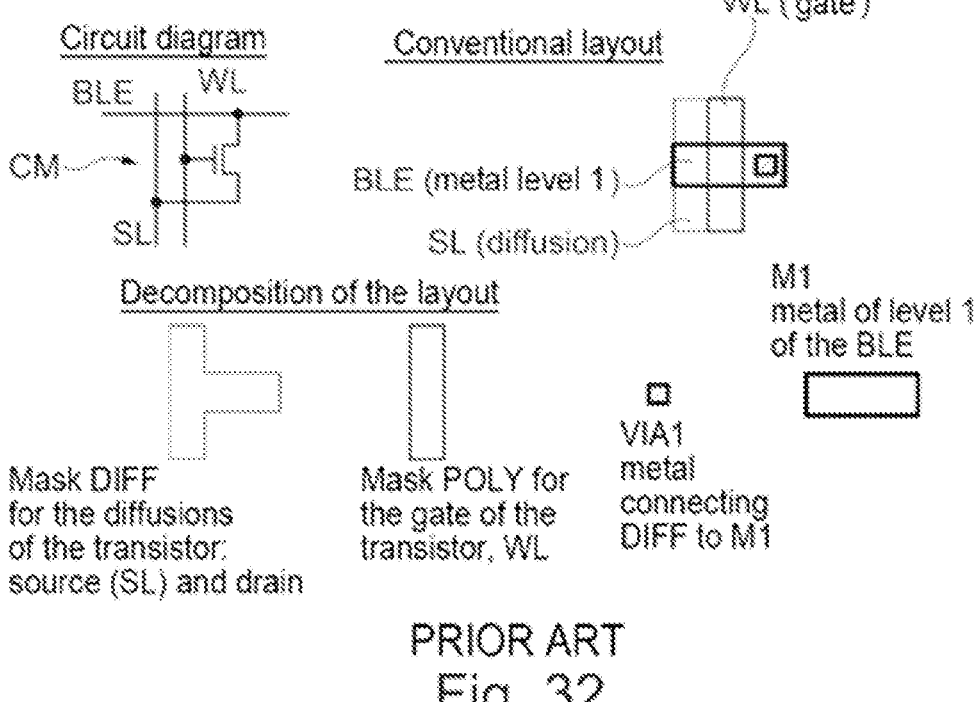
FIG. 32 schematically shows a conventional mask set for a ROM memory cell.

FIG. 32 schematically shows a conventional mask set for a ROM memory cell, showing the layout of the connections of the gate, of the drain and of the source of the transistor, with respect to the metal M1 of level 1 of the elementary bit line BLE. The (drain and source) diffusions of the transistor have the same DIFF mask, taking the form of a T rotated by 90° in the counter-clockwise direction. The source is connected to the source line SL. The gate, which is connected to the word line WL, has a mask POLY taking the form of a rectangle. These masks are superposed as required by the electronic-circuit manufacturing process used. The drain diffusion is connected by a via "via1" to the metal M1 of the elementary bit line BLE.

Figure 33:
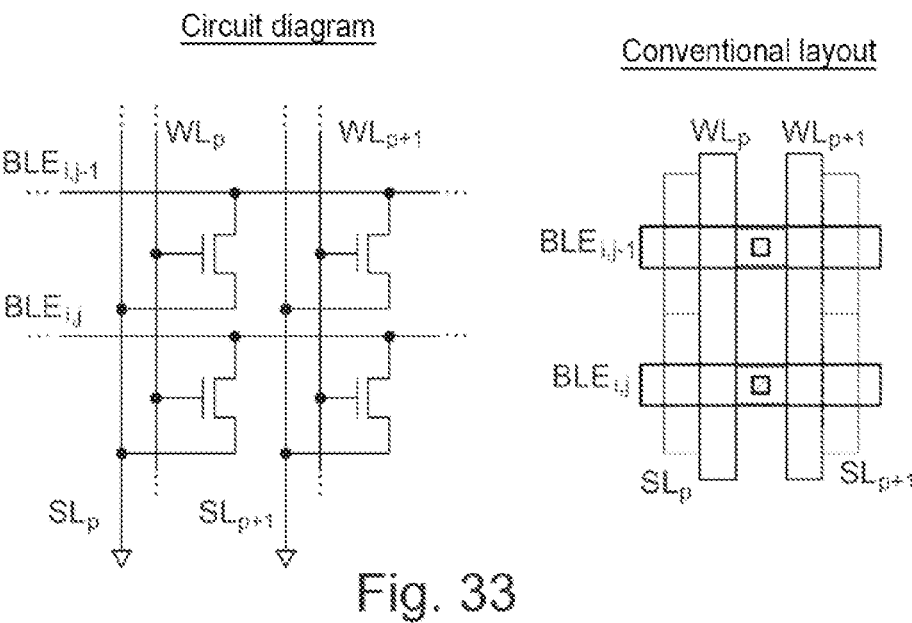
FIG. 33 schematically illustrates an example of a layout of mask sets for ROM memory cells allowing a memory array to be formed.

FIG. 33 schematically illustrates an example of a layout of mask sets for ROM memory cells allowing a memory array to be formed.

Figure 34:
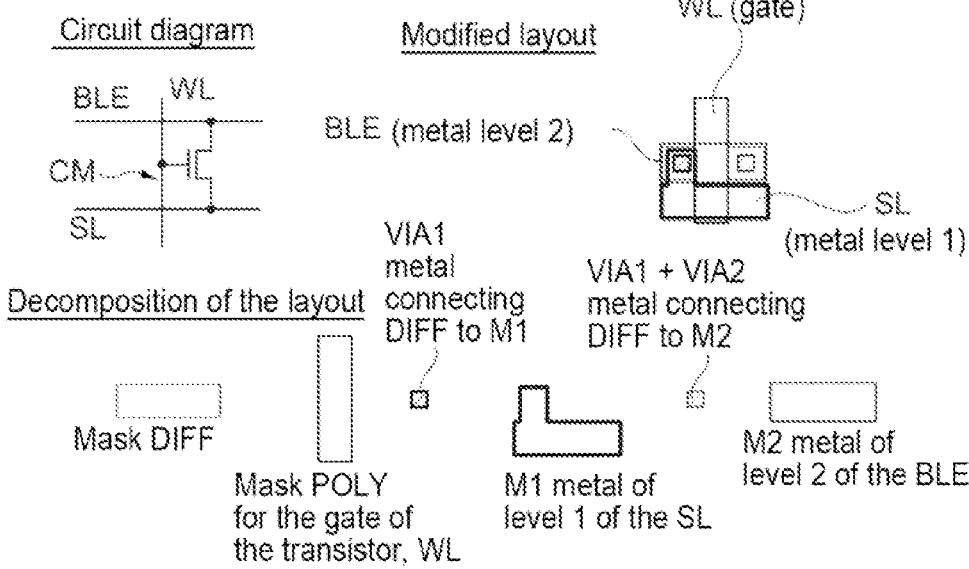
FIG. 34 schematically shows an example of a modified mask set for a ROM memory cell in the case of modified electrical connection of the sources of the transistors.

FIG. 34 schematically illustrates an example of a mask set according to the invention for a ROM memory cell in the case of modified electrical connection of the sources of the transistors. All the masks are superposed as required by the electronic-circuit manufacturing process used. The source diffusion of the NMOS transistor is connected by a via "via1" to the metal M1 of the source line SL. The drain diffusion of the NMOS transistor is electrically connected by two vias "via1" and "via2" to the metal M2 of the elementary bit line BLE. The gate of POLY forms the word line WL. This arrangement makes it possible to obtain elementary bit lines BLE and source lines SL that are parallel to one another and orthogonal to the word lines WL, as illustrated in FIGS. 30 and 31 for example.

Figures 35, 36:
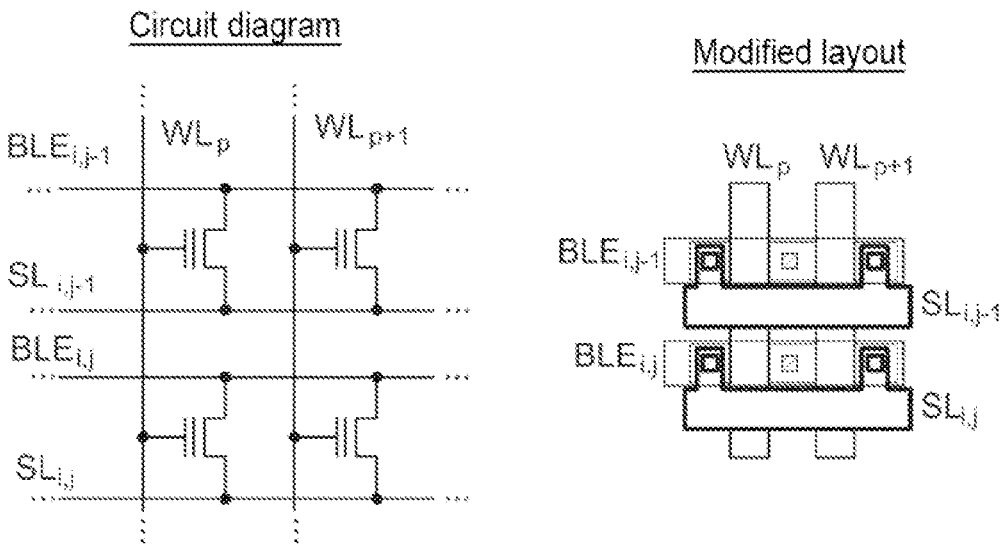
FIG. 35 schematically illustrates association of mask sets of a plurality of adjacent ROM memory cells in the case of modified electrical connection of the sources of the transistors.
FIG. 36 is a flowchart illustrating steps of a method for detecting and correcting faults during a read operation according to the invention.

FIG. 35 schematically illustrates association of mask sets of a plurality of adjacent ROM memory cells in the case of modified electrical connection of the sources of the transistors.

FIG. 36 is a flowchart illustrating steps of a method for detecting and correcting faults according to the invention.

The method begins with a step 301 corresponding to read-out of a word from memory. Next, triggering of an alarm is tested in a step 302. It will be noted that whether an alarm is triggered or not depends on the value of the alarm bit AL. If the alarm is triggered (branch 303), step 301 is returned to, to read out the same word again. Otherwise (branch 304), the final step 305 in which the read word is correct is reached, and read-out may be continued. Moreover, a fault may also be detected during programming of a memory cell CM.

Figure 37:
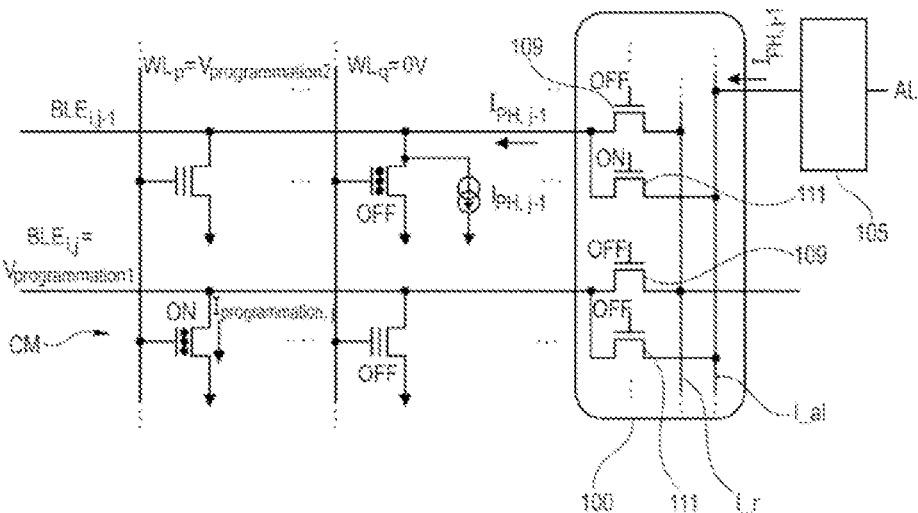
FIG. 37 schematically shows a NOR flash memory architecture with a column decoder modified according to the invention to detect a fault in an elementary bit line adjacent to the one being programmed.

FIG. 37 shows a column decoder 100 according to the invention, configured to detect a fault (indicated by the presence of a disrupting current $I_{PH,j-1}$) in an elementary bit line $BLE_{i,j-1}$ adjacent to the one associated with the memory cell CM being programmed $BLE_{i,j}$.

The adjacent line BLE may be located immediately above or below the line BLE associated with the memory cell being programmed (or in proximity thereto, in the area of influence of the fault-creating effect).

All the selection transistors 109 connected to the read line l_r are in the OFF state, thus preventing any read-out.

The word line WL of index p ($WL_p$) is raised to the potential $V_{programmation2}$ and the elementary bit line associated with the memory cell CM being programmed $BLE_{i,j}$ is raised to the potential $V_{programmation1}$.

Only the alarm transistor 111 connected to the adjacent line BLE ($BLE_{i,j-1}$ in FIG. 37) is turned on to detect exceedance of an alarm threshold current $I_{alarm}$, the alarm transistor 111 for $BLE_{i,j}$ being in the OFF state.

If $I_{PH, j-1} > I_{alarm}$, the alarm bit AL is activated.

It will be noted that the detection circuit 105 may already be present in the circuit and reused to detect the fault or added for this purpose.

The detection circuit 105 may be present for each of the N bits forming a word, i.e. for each of the bit lines $BL_i$.

Figure 38:
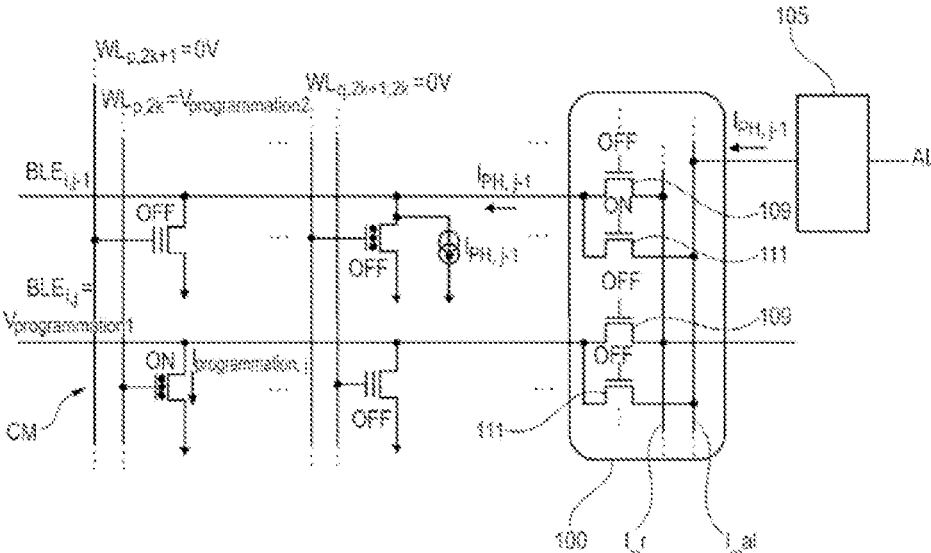
FIG. 38 is analogous to FIG. 37 with split word lines.

FIG. 38 is analogous to FIG. 37 but shows split word lines, all the floating-gate transistors of the line $BLE_{i,j-1}$ (adjacent to the line $BLE_{i,j}$ associated with the memory cell CM being programmed) being turned off, with a voltage of zero applied to their control gates. Thus, it is possible to detect the disrupting current $I_{PH, j-1}$ flowing through the line $BLE_{i,j-1}$ by comparing it with the alarm threshold current $I_{alarm}$, as explained above with reference to FIG. 37.

Figure 39:
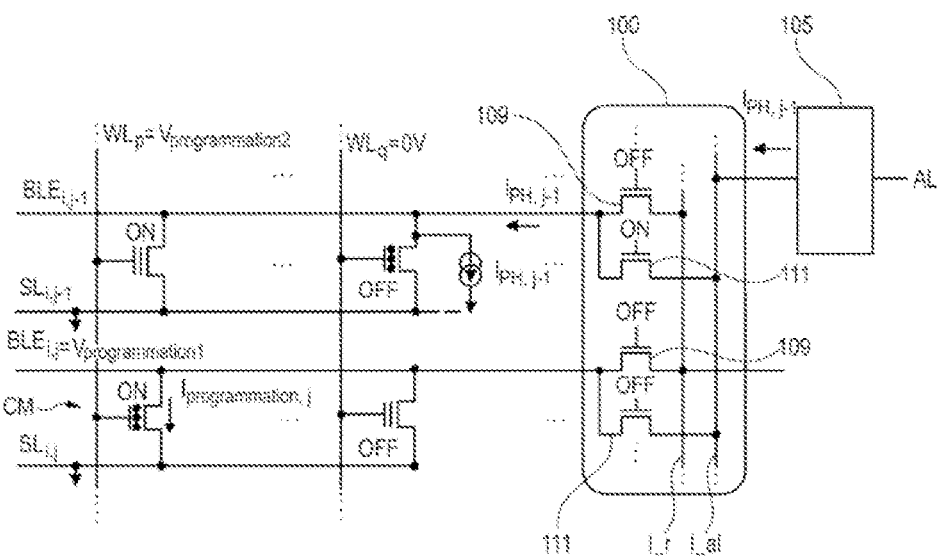
FIG. 39 is analogous to FIG. 37 with modified electrical connection of the sources of the floating-gate transistors.

FIG. 39, which is analogous to FIG. 37, illustrates connection of the sources of the transistors of the lines BLE such as to make it possible to electrically isolate from ground the sources of the floating-gate transistors of the line BLE adjacent to the BLE associated with the memory cell CM being programmed. The sources of the transistors of a given BLE are now connected to a common line SL raised to a given potential.

If $SL_{i,j-1}$ is high impedance (HZ), the elementary bit line $BLE_{i,j-1}$ (used to detect the disrupting current $I_{PH, \ j-1}$) adjacent to the line $BLE_{i,j}$ associated with the memory cell CM being programmed has no path of electrical connection to ground. It is thus possible to detect a disrupting current $I_{PH, \ j-1}$ flowing through the line $BLE_{i, \ j-1}$ by comparing it with the alarm threshold current $I_{alarm}$, as explained above with reference to FIG. 37.

Figure 40:
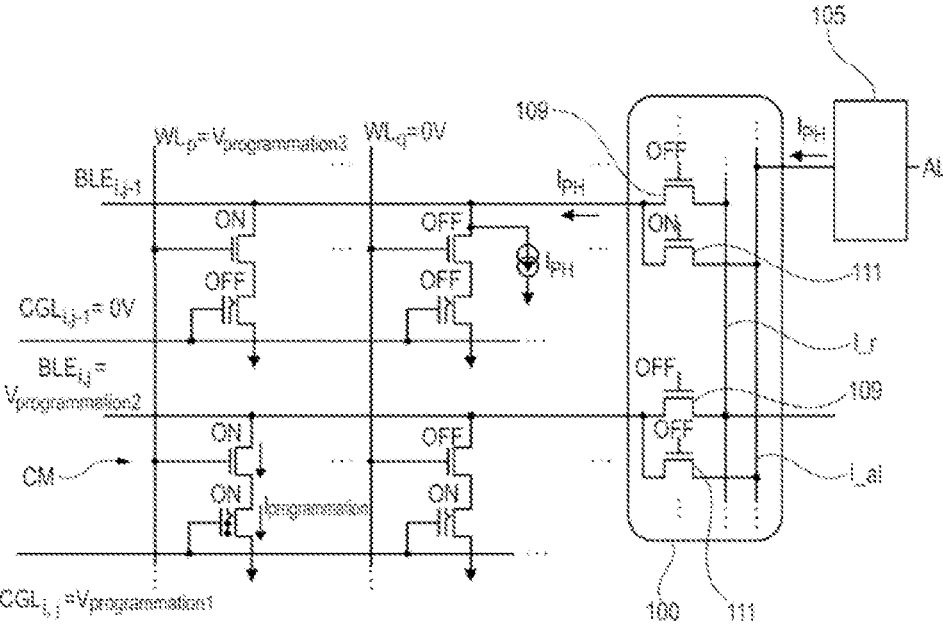
FIG. 40 schematically shows an EEPROM architecture with a column decoder modified according to the invention to detect a fault in an elementary bit line adjacent to the one being programmed.

FIG. 40 schematically shows an EEPROM memory architecture with a column decoder modified according to the invention to detect a fault (indicated by the presence of a disrupting current $I_{PH, j-1}$) in an elementary bit line $BLE_{i, \ j-1}$ adjacent to the one associated with the memory cell CM being programmed $BLE_{i,j}$.

The adjacent line BLE may be located immediately above or below the line BLE associated with the memory cell being programmed (or in proximity thereto, in the area of influence of the fault-creating effect).

All the selection transistors 109 connected to the read line l_r are in the OFF state, thus preventing any read-out.

The word line WL of index p ($WL_p$) is raised to the potential $V_{programmation3}$, the elementary bit line associated with the memory cell CM being programmed $BLE_{i,j}$ is raised to the potential $V_{programmation2}$, and the gate control line $CGL_{i,j}$ of the state transistor of the memory cell CM being programmed is raised to the potential $V_{programmation1}$.

Only the alarm transistor 111 connected to the adjacent line BLE ($BLEi_{j-1}$ in FIG. 40) is turned on to detect exceedance of an alarm threshold current $I_{alarm}$, the alarm transistor 111 for $BLEi_{j}$ being in the OFF state.

The word line WL of index q ($WL_q$) is raised to a potential of zero, as is the gate control line $CGL_{i,j-1}$ of the state transistor of the memory cell located at the intersection of the word line $WL_p$ and of the adjacent elementary bit line $BLE_{i,j-1}$.

If $I_{PH, \ j-1} > I_{alarm}$, the alarm bit AL is activated.

It will be noted that the detection circuit 105 may already be present in the circuit and reused to detect the fault or added for this purpose.

Figure 41:
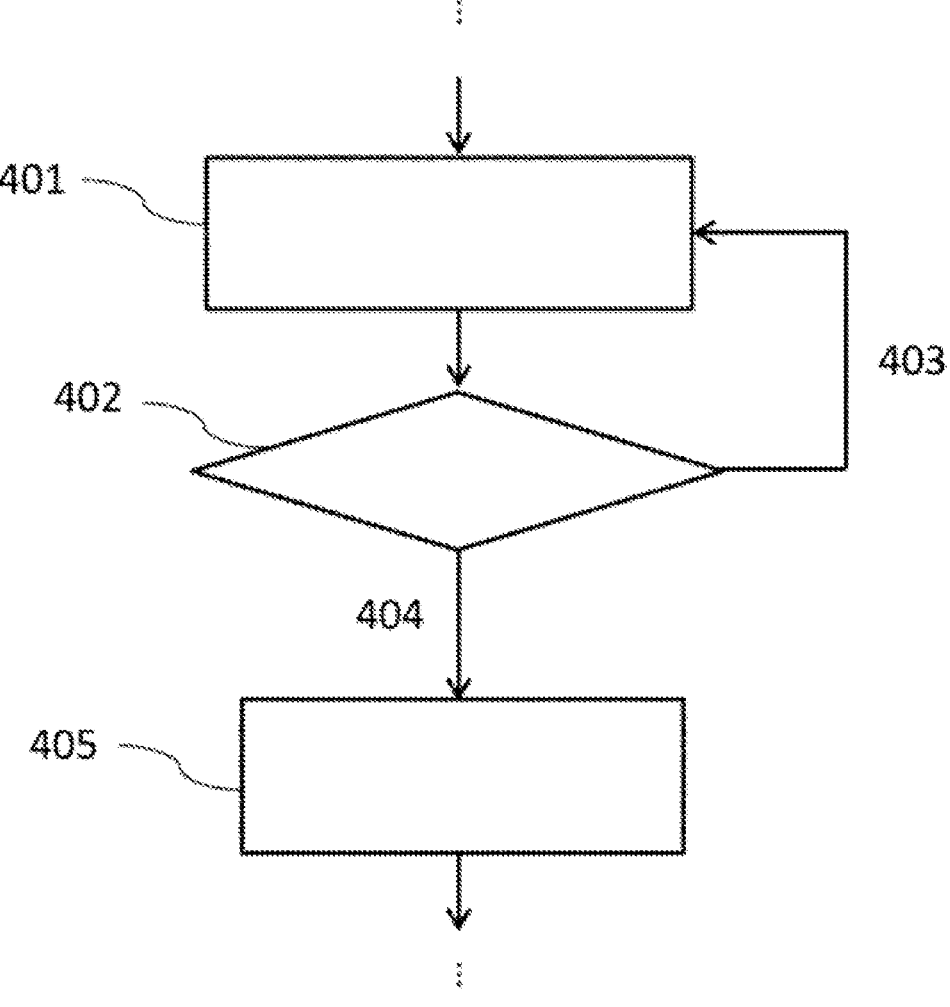
FIG. 41 is a flowchart illustrating steps of a method for detecting and correcting faults during a write operation according to the invention.

The detection circuit 105 may be present for each of the N bits forming a word, i.e. for each of the bit lines $BL_i$. FIG. 41 is a flowchart illustrating steps of a method for detecting and correcting faults affecting the circuit being programmed.

The method begins with a step 401 corresponding to programming of a word in memory. Next, in a step 402, triggering of an alarm due to detection of an excess current created by a laser shot or passage of a radiative particle is tested. It will be noted that whether an alarm is triggered or not depends on the value of the alarm bit AL. If the alarm is triggered (branch 403), step 301 is returned to, to program the same word again. Otherwise (branch 404), the final step 405 in which the programmed word is correct is reached, and programming may be continued.

This method is well suited to faults of natural origin. In the event of an attack, the attacker could repeat a laser shot. It is therefore possible to propose, potentially after a plurality of faults have been detected in succession, other strategies that cause the memory to be erased or the circuit reset, etc.

The invention may be used to detect attacks in secure systems and to mitigate the effects of radiation on memory circuits.

The invention is not limited to the examples of embodiment that were described above, and may be extended to other types of memories, provided that modifications allowing adaptation to their structures are made.

The MOS logic described in the above examples may be inverted, i.e. it is possible to use PMOS transistors instead of NMOS transistors and vice versa.

The invention claimed is:

1. A method for detecting at least one fault caused by a photoelectric or radiative effect in a non-volatile semiconductor memory, the memory comprising a plurality of memory cells containing MOS transistors, potentially floating-gate MOS transistors, each memory cell being located at the intersection of an elementary bit line and of a word line, in which method:

to detect the potential presence of at least one fault during read-out of a memory cell, the binary content of a memory cell being read out by detecting a read current flowing through this memory cell during read-out after this memory cell has been selected by means of the elementary bit line and word line, a comparison is made between the total current flowing through the elementary bit line to which the memory cell being read out belongs, or flowing through at least one elementary bit line other than the one to which the memory cell being read out belongs, and a predefined threshold representative of the presence of at least one fault in the one or more memory cells other than the one being read out.

2. The method as claimed in claim 1, said at least one elementary bit line via which fault detection is performed being the bit line associated with the memory cell (CM) being read out.

3. The method as claimed in claim 2, wherein the predefined threshold is substantially equal to twice the amplitude of the read current normally observed in the absence of fault.

4. The method as claimed in claim 1, wherein said at least one elementary bit line via which fault detection is performed is adjacent to the one associated with the memory cell being read out or programmed.

5. The method as claimed in claim 4, wherein fault detection is performed via a single line adjacent to the one associated with the memory cell being read out or programmed.

6. The method as claimed in claim 4, fault detection being performed via the two lines flanking the elementary bit line associated with the memory cell being read out or programmed.

7. The method as claimed in claim 4, said at least one elementary bit line via which fault detection is performed belonging to the same block as the memory cell being read out or programmed.

8. The method as claimed in claim 4, said at least one elementary bit line via which fault detection is performed belonging to the block following or preceding the one comprising the memory cell being read out or programmed.

9. The method as claimed in claim 4, the memory comprising split word lines, each pair of word lines having a word line of even index 2k and a word line of odd index 2k+1, the gates of the transistors of the memory cells being alternately connected to the word line of even index and to the corresponding word line of odd index, at least one pair of word lines having one of its lines raised to a read potential or to a write potential to activate the memory cells that are connected thereto and the other of its lines raised to a potential deactivating the memory cells that are connected thereto, so as to activate the read memory cells of every other elementary bit line or to program every other elementary bit line and to perform fault detection in said at least one elementary bit line adjacent to the one associated with the memory cell being read out or being programmed.

10. The method as claimed in claim 9, wherein the predetermined threshold is set lower than twice the amplitude of the read-out current normally observed in the absence of fault.

11. The method as claimed in claim 4, the sources of the transistors associated with each elementary bit line being connected to a respective common line raised to a given potential, at least during read-out or programming of the corresponding memory cells, and the sources of the transistors associated with said at least one adjacent elementary bit line being electrically isolated from said given potential, at least during fault detection.

12. The method as claimed in claim 1, fault detection being performed via one or more elementary bit lines not adjacent to the one associated with the memory cell being read out or programmed.

13. The method as claimed in claim 1, wherein, in case of detection of a fault on an elementary bit line, read-out of that line is repeated a predetermined number of times provided that a fault is still detected on that line.

14. The method as claimed in claim 1, wherein, in case of detection of a fault when programming a word in memory, programming of that line is repeated a predetermined number of times provided that a fault is still detected.

15. A method for detecting at least one fault caused by a photoelectric or radiative effect in a non-volatile semiconductor memory, the memory comprising a plurality of memory cells containing MOS transistors, potentially floating-gate MOS transistors, each memory cell being located at the intersection of an elementary bit line and of a word line, in which method to detect the potential presence of at least one fault during programming of at least one memory cell, a comparison is made between the current flowing through at least one elementary bit line other than the one to which the memory cell being programmed belongs, and a predefined threshold representative of the presence of at least one fault in this line.

16. A non-volatile semiconductor memory circuit, the memory circuit being configured to detect the potential presence of at least one fault caused by a photoelectric or radiative effect, and comprising a plurality of memory cells containing MOS transistors, potentially floating-gate MOS transistors, each memory cell being located at the intersection of an elementary bit line and of a word line, the memory circuit comprising at least one alarm circuit the input of which is connected to at least one elementary bit line via which fault detection is performed, the alarm circuit having an output the state of which indicates whether or not said at least one fault is present, the alarm circuit being configured to:

detect the potential presence of at least one fault during read-out of a memory cell, the binary content of a memory cell being read out by detecting a read current flowing through this memory cell during read-out after this memory cell has been selected by means of the elementary bit line and word line, by making a comparison between the total current flowing through said at least one elementary bit line via which fault detection is performed, and a predefined threshold representative of the presence of at least one fault in one or more memory cells other than the one being read out.

17. A non-volatile semiconductor memory circuit, the memory circuit being configured to detect the potential presence of at least one fault caused by a photoelectric or radiative effect, and comprising a plurality of memory cells containing MOS transistors, potentially floating-gate MOS transistors, each memory cell being located at the intersection of an elementary bit line and of a word line, the memory circuit comprising at least one alarm circuit the input of which is connected to at least one elementary bit line via which fault detection is performed, the alarm circuit having an output the state of which indicates whether or not said at least one fault is present, the alarm circuit being configured to detect the potential presence of at least one fault during programming of at least one memory cell, by making a comparison between the current flowing through at least one elementary bit line other than the one to which the memory cell being programmed belongs, and a predefined threshold representative of the presence of at least one fault in this line.

18. The memory circuit as claimed in claim 17, the memory circuit being a NOR flash memory circuit, wherein each memory cell comprises a floating-gate MOS transistor the control gate of which is connected to the corresponding word line and the drain of which is connected to the corresponding elementary bit line.

19. The memory circuit as claimed in claim 17, the memory circuit being an EEPROM memory circuit, wherein each memory cell comprises two transistors in series: a MOS selection transistor and a floating-gate state transistor, the gate of the selection transistor being connected to the word line associated with said cell, the drain of the selection transistor being connected to the elementary bit line associated with said cell, the control gate of the state transistor being connected to a bias voltage.

20. The memory circuit as claimed in claim 19, comprising an address decoder that transmits, for each elementary bit line, the bias voltage to the control gates of the state transistors.

21. The memory circuit as claimed in claim 17, the memory circuit being a ROM memory circuit, wherein each memory cell comprises a MOS transistor the gate of which is connected to the associated word line and the drain of which is connected to the associated elementary bit line, the memory circuit comprising a read-out device connected to each elementary bit line, the read-out device comprising a MOS pull-up transistor.

22. The memory circuit as claimed in the claim 21, the sources of the MOS transistors associated with each elementary bit line being connected to a respective common line raised to a given potential, at least during read-out of the corresponding memory cells, and the sources of the transistors associated with at least one adjacent elementary bit line being electrically isolated from said given potential, at least during fault detection.

23. The memory circuit as claimed in claim 21, said at least one alarm circuit comprising the read-out device.

24. The memory circuit as claimed in claim 17, comprising a column decoder comprising a selection transistor connected to each elementary bit line for selection thereof, and comprising, for each elementary bit line via which fault detection is performed, an alarm transistor connected in parallel with the selection transistor, the alarm transistor being connected to said at least one alarm circuit.

25. The memory circuit as claimed in claim 24, the alarm circuit comprising at least one detection circuit, this detection circuit comprising a voltage comparator having a first input connected to a reference voltage and a second input connected to the alarm transistor of the elementary bit line via which fault detection is performed, the fault being detected when the voltage on the second input is lower than the reference voltage, the alarm transistor being on during fault detection.

26. The memory circuit as claimed in claim 25 in combination with claim 21, said at least one detection circuit being separate from the read-out device.

* * * * *